United States Patent [19]

Tietsworth

[11] Patent Number: 5,233,537

[45] Date of Patent: Aug. 3, 1993

[54] VERY LOW FREQUENCY AND LOW FREQUENCY TRANSMITTING ANTENNA PARAMETER MONITORING SYSTEM

[75] Inventor: Steven C. Tietsworth, San Diego, Calif.

[73] Assignee: The United States of America as represented by the Secretary of the Navy, Washington, D.C.

[21] Appl. No.: 713,658

[22] Filed: Jun. 11, 1991

[51] Int. Cl.$^5$ .................................. H04B 17/00
[52] U.S. Cl. ........................... 364/481; 364/484; 343/703
[58] Field of Search ............... 343/703; 364/485, 484, 364/483, 514, 481

[56] References Cited

U.S. PATENT DOCUMENTS

| | | | |
|---|---|---|---|
| 4,006,348 | 2/1977 | Ochiai et al. | 364/481 |
| 4,075,697 | 2/1978 | Ochiai et al. | 364/481 |
| 4,409,544 | 10/1983 | Redlich | 324/650 |
| 4,588,993 | 5/1986 | Babij et al. | 343/703 |
| 4,823,280 | 8/1989 | Mailandt et al. | 364/514 |
| 4,906,916 | 3/1990 | Koslar | 364/487 |
| 4,949,290 | 8/1990 | Pike et al. | 364/580 |
| 5,122,800 | 6/1992 | Philipp | 364/487 |

*Primary Examiner*—Jack B. Harvey
*Assistant Examiner*—Jae H. Choi
*Attorney, Agent, or Firm*—Harvey Fendelman; Thomas Glenn Keough

[57] ABSTRACT

A very low frequency and low frequency transmitting antenna parameter monitoring system is used to measure the electric circuit parameters in near real time of very low frequency and low frequency transmitting antenna systems transmitting frequency shift keyed modulation. The primary parameters measured by the system are the antenna feed-point voltage, antenna current, gross resistance, gross reactance and steady-state phase angle between the voltage and current. Four primary sections provide for antenna system sensing by sensors, triggering, analog-to-digital conversion of the sensor outputs and computer processing of the digital data to arrive at the desired antenna parameters. These parameters are essential in evaluating antenna performance and in diagnosing problems with the antenna system.

8 Claims, 8 Drawing Sheets

VERY LOW FREQUENCY AND LOW FREQUENCY TRANSMITTING ANTENNA PARAMETER MONITORING SYSTEM

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

To date, there has been no practical way to measure, in near real time, the gross resistance and reactance of VLF, very low frequency and LF, low frequency, transmitting antennas while the antennas were on the air transmitting message traffic. These parameters could be measured only when the antenna was broadcasting a single frequency (CW), signal which contains no information. Therefore the transmitter effectively had to be taken out of service to make measurements of the resistance and reactance. Due to the operational requirement that these antennas need be on the air continuously for weeks at a time, taking them off the air to make these measurements only could be accomplished once or twice per month.

As a consequence, it could not be known with certainty if a particularly antenna transmitting system were operating properly in the interim so that reliable communications could be compromised without any indication of malfunction. The possibility of an undetected malfunction could have a eroding effect regarding the confidence of those depending on the reliability of the system as well limiting the system when compared to the intended capabilities of the system. The only capability that is currently available at the VLF and LF sites is measurement of the magnitude of the voltage and current at the transmitter output. No information on phase angle can currently be obtained and consequently the circuit parameters of the antenna and the associated tuning system resistance, Rg, capacitance, Cg and inductance, Lg are not measurable in near real time using contemporary measurement systems.

Thus, a continuing need exists in the state of the art for a system which provides for operational parameter measurements which could be made as frequently as one every second without taking an antenna out of service and, in addition, the system should have the capability for providing a PC, personal computer, based antenna voltage and current monitor system that allows remote monitoring via ordinary phone lines of the antenna parameters at any of the sites of remote antenna systems throughout the world.

SUMMARY OF THE INVENTION

The present invention is directed to providing a method and apparatus for measuring antenna electrical circuit parameters in near real time for a VLF and LF transmitting antennas transmitting frequency shift keyed modulation. A block of antenna frequency shift keyed modulation sample signals are fed from an antenna sensing section to an analog-to-digital converter and to a trigger circuit and the block of sample signals are monitored by the trigger circuit which provides an output trigger signal when the trigger circuit indicates that a steady state condition of the block of sample signals has been reached. The analog-to-digital converter is enabled by the output trigger signal to receive and digitize the block of sample signals when, first of all, the analog-to-digital converter has been enabled by a interconnected computer after the computer is ready to download the digitized block of sample signals thereto, and secondly, when the trigger circuit provides the output trigger signal which indicates that a steady state condition has been reached. The digitized block of sample signals is transmitted by the analog-to-digital converter to the computer upon the receipt of the output trigger signal and the computer monitors the state of the analog-to-digital converter to determine that the digitized block of sample signals has been transmitted to the computer by the analog-to-digital converter. After the analog-to-digital converter is placed on-hold by the computer to allow it to finish a processing of the digitized block of sample signals, the digitized block of sample signals is processed in the computer to determine and provide indications in near real time antenna feed-point voltage, antenna current, gross resistance, gross reactance and steady-state phase angle between the voltage and current. An object of the invention is to provide a system capable of measuring transmitter antenna electrical circuit parameters.

Another object is to provide a measurement system for measuring the electrical circuit parameters, in near real time of antenna feed point voltage, antenna current, gross resistance, gross reactance and steady state phase angle between voltage and current.

Another object is to provide the characteristic parameters of the preceding paragraph of VLF and LF transmitting antenna systems.

Yet another object is to provide a measuring system capable of being operated remotely using ordinary telephone lines to instantly monitor the performance of remote VLF and LF transmitting antennas located throughout the world.

Another object is to provide a method to determine phase angle and the measurement of circuit parameters Rg, Cg, and Lg in near real time.

Another object is to provide a system that uses a trigger circuit to determine when the circuit is in a pseudo steady state condition so that several novel digital signal processing routines can proceed to calculate the parameters Rg, Cg, and Lg, as well as antenna current, voltage, phase angle, and reactance.

Another object is to provide a system that can be operated remotely using ordinary telephone lines to instantly monitor the performance of any of the VLF and LF antennas located throughout the world when coupled with currently available modems and software.

These and other objects of the invention will become more readily apparent from the ensuing specification and claims when taken in conjunction with the appended drawings.

DESCRIPTION OF THE PREFERRED EMBODIMENT

Figure 1:
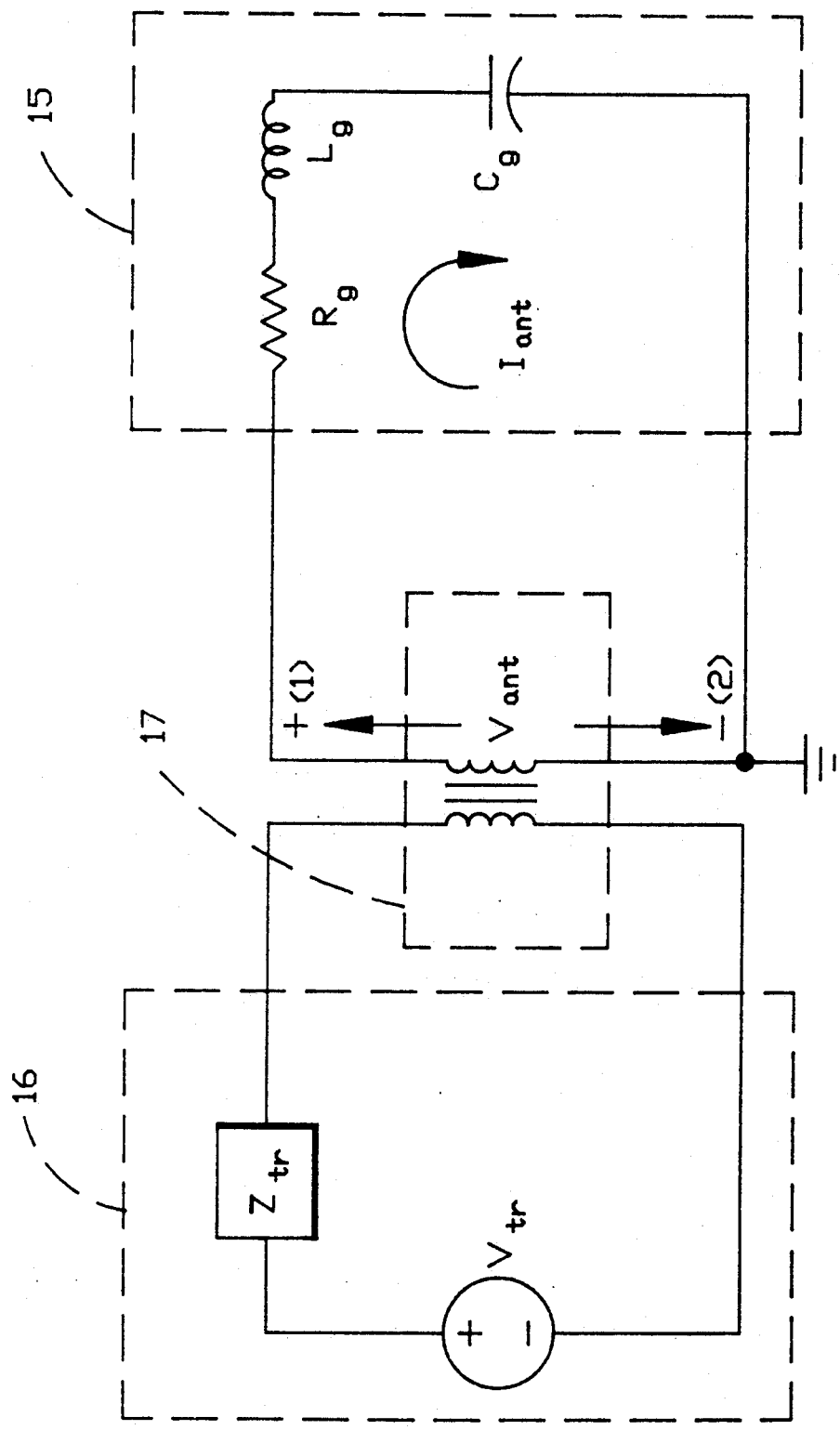
FIG. 1 is a schematic depiction of a typical VLF and LF antenna system equivalent circuit.

Referring once again to FIG. 2, analog very low frequency and low frequency antenna parameter monitoring system 10 is used to measure the electrical circuit parameters in near real time of very low frequency (VLF) and low frequency (LF) transmitting antenna systems 15 transmitting frequency shift keyed modulation. The primary parameters measured by this system are the antenna feed point voltage, antenna current, gross resistance, gross reactance and steady state phase angle between the voltage and current. Antenna parameter monitoring system 10 consists of four primary functional sections 20, 30, 40 and 50 therefor. These sections respectively perform antenna system sensing in section 20, triggering and in section 30 analog-to-digital conversion of the sensor outputs in section 40, and computer processing of the digital data in section 50 to estimate the desired antenna parameters.

Referring to FIG. 1 the electrical equivalent circuit model is depicted for a typical VLF or LF transmitting antenna 15 transmitting frequency shift keyed modulation. Transmitter 16 is represented by the ideal voltage source Vtr, and the Impedance, Ztr, which models the reactance and losses in the transmitter system. The antenna and associated tuning system is represented by the three passive components Rg, Lg, and Cg. The capacitive component in the antenna circuit, Cg, comes primarily from the antenna top hat configuration due to the capacitance between the top hat and the ground screen. There also will be some contribution to Cg from stray capacitances between the tower and ground and the cabling and up-leads to ground. The inductive component, Lg, comes from the stray inductance in the cabling combined with an added series inductance, usually in the form of a helix and/or a variometer, which is used to tune the circuit to the desired operating frequency. The resistive component, known as the gross resistance and labeled Rg, comes from series ohmic losses in the transmission line, the ground screen, and the antenna structure, combined with the radiation resistance of the antenna. The voltage at the feed point of the antenna is labeled Vant in FIG. 1, and the antenna current, which when squared is proportional to the antenna radiated power, is labeled as Iant. These two signals are time functions which completely characterize the other antenna circuit parameters described above.

In general, it is not difficult to measure the antenna parameters described above for this type of series RLC circuit if it is driven by a single frequency sinusoidal signal. When the antenna system, however, is driven by a signal consisting of some type of frequency shift modulation as is normally used in VLF and LF communications systems, the voltage and current signals in the antenna remain at a single instantaneous frequency for relatively short periods of time. These periods of time are integer multiples of the bit period of the underlying baseband digital signal.

Antenna parameter monitoring system 10 uses the fact that due to the random statistical nature of the underlying binary data signal coming into the transmitter, the modulated voltage signal going to antenna 15 may remain at a single instantaneous frequency for more than one bit period. If the voltage does remain at the same frequency for a sufficiently large number of bit periods then the corresponding current signal will reach an approximately steady state condition, in terms of its magnitude and phase angle, with respect to the voltage signal. When this pseudo steady state condition occurs, steady state circuit analysis can be applied to the current and voltage signals to calculate the voltage, current, and phase angle between the voltage and current.

In antenna parameter monitoring system 10, this circuit analysis is done in a unique way by sampling the voltage and current only after a sufficiently long period of time has elapsed between frequency transitions to ensure that the circuit is in the pseudo steady state condition described above. This is done using a trigger circuit, to be discussed below, that detects each frequency transition and then waits the desired amount of time to reach the pseudo steady state condition. If the desired amount of time, known as the settling time, elapses without a frequency transition in the voltage signal occurring, the trigger circuit outputs a pulse to the analog-to-digital converter to initiate the sampling procedure. If a frequency transition occurs before the settling time has elapsed, the trigger circuit resets and starts the countdown again.

Figure 2:
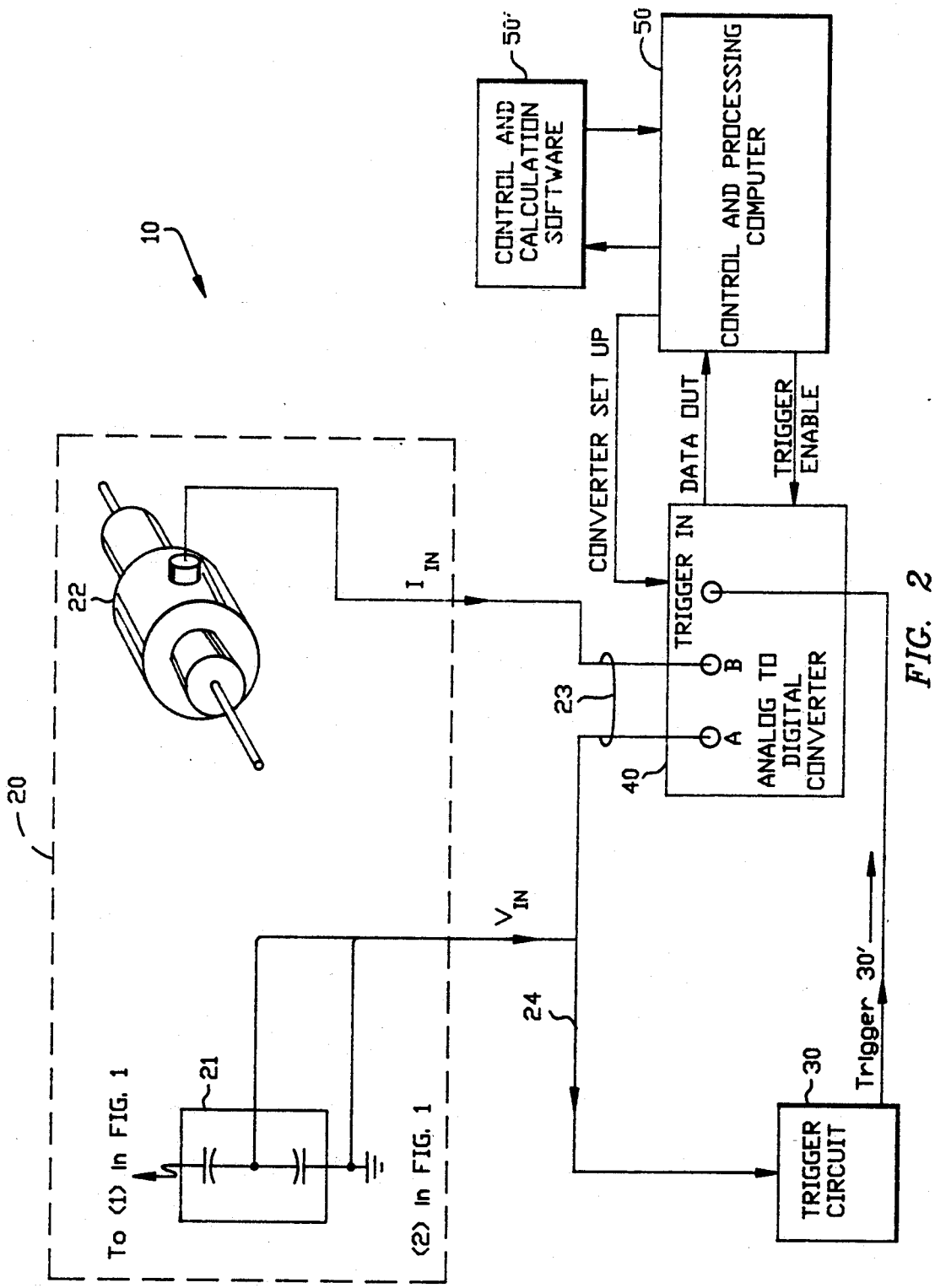
FIG. 2 is a block diagram of the antenna parameter monitoring system in accordance with this inventive concept.
Figure 3:
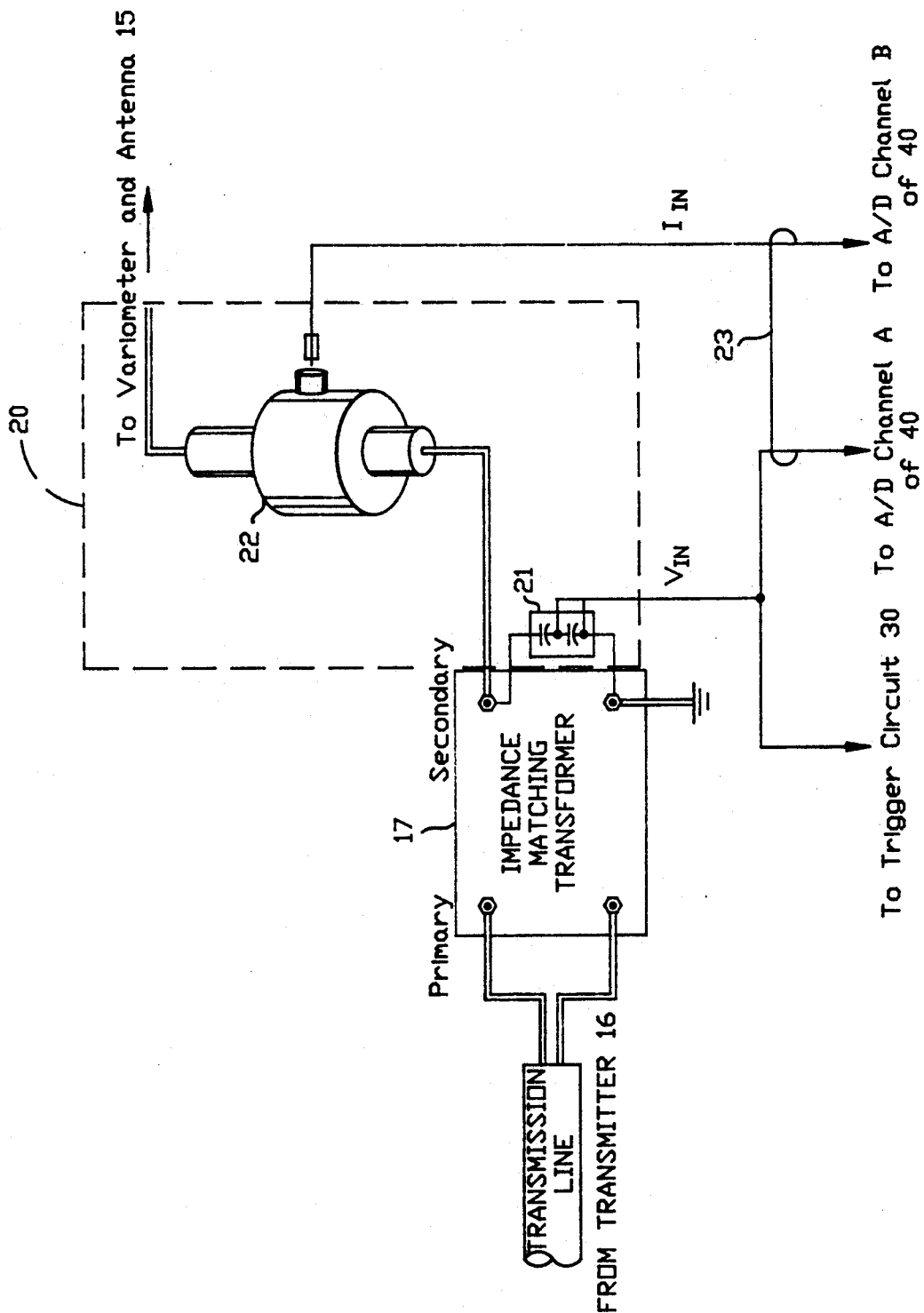
FIG. 3 sets forth the interconnection of the antenna parameter monitoring system to the transmitting antenna system.

FIG. 2 shows a diagram of a complete antenna parameter monitoring system 10 system and FIG. 3 shows the connections between system 10 and transmitting antenna 15. System 10 uses sensing section 20 having two signal sensors 21 and 22, shown at the upper left side of FIGS. 2 and 3 and connected to the antenna feed point, to obtain signals from VLF or LF antenna 15. Sensor 21 is a capacitive voltage divider which is used to sense the antenna feed point voltage labeled as Vant in FIG. 1. Sensor 22 is an inductive current probe which senses the antenna current, labeled as Iant in FIG. 1. The signals from these two sensors are fed to the analog-to-digital converter 40 via double shielded coaxial cable 23 which minimizes the interference from the high magnetic field strength in the vicinity of the antenna.

The signal from voltage divider 21 also is fed to trigger circuit 30 via double shielded coaxial cable 23, see FIGS. 2 and 3. Trigger circuit 30 detects frequency transitions in the incoming FSK, frequency shifted keyed or MSK, minimum shifted keyed, modulated signal $V_{IN}$ and after each frequency transition starts counting the preset settling time. If counter 31, see FIG. 4, is able to count down the required time before another frequency transition occurs, trigger circuit 30 outputs a trigger pulse 30' to trigger analog-to-digital converter 40.

Figure 4:
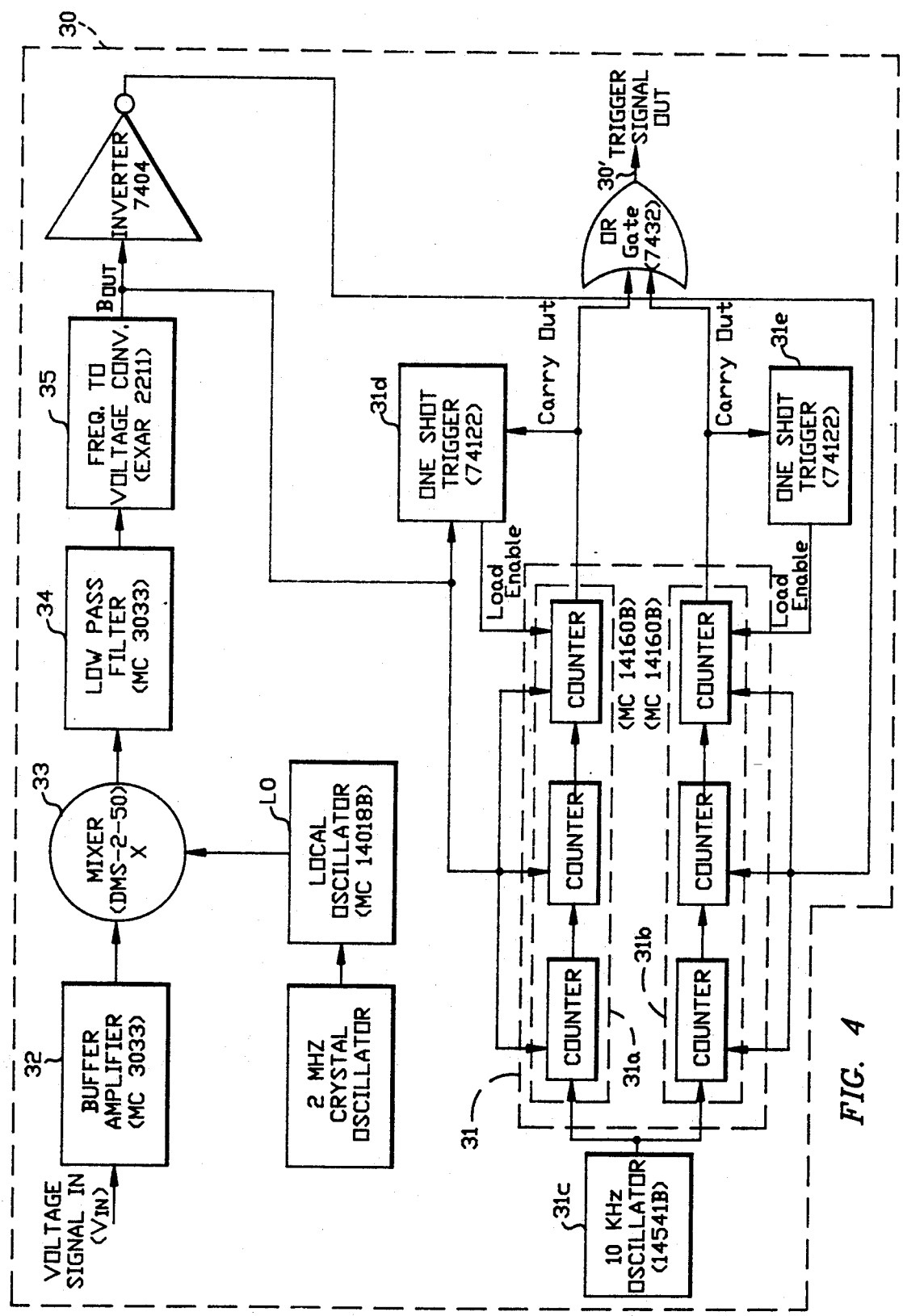
FIG. 4 is a block diagram of the trigger circuit of the transmitting antenna parameter monitoring system.

In the circuit of FIG. 4, an incoming modulated signal $V_{IN}$ is amplified at 32, heterodyned at mixer 33 down to the intermediate frequency of 5 Khz and then a frequency discriminator 35 demodulates the signal to provide a baseband output $B_{OUT}$. Baseband output $B_{OUT}$ is then fed to two counter circuit banks 31a and 31b, 31a begins counting down on the high-to-low transitions and 31b begins counting down on the low-to-high transitions. The countdown time is variable from one antenna system to another because it is a function of each individual antenna's circuit parameters; however, a typical value is between two- and three-bit periods of the baseband signal. If either counter counts down the countdown time before being reset by a frequency transition, trigger circuit 30 outputs a trigger pulse 30' which is fed to analog-to-digital converter section 40.

Referring to FIGS. 1 and 2 of the drawings, the -to-digital converter 40 of antenna parameter monitoring system 10 takes samples of the voltage and current signals whenever it is enabled by a control computer 50 and triggered by trigger circuit 30. After sampling and quantizing the samples of the voltage and current in two arrays of 512 points each, analog-to-digital converter 40 stores the samples in a memory buffer and signals control computer 50 that data acquisition is complete. Analog-to-digital converter 40 is then in a disabled state until control computer 50 downloads the acquired data, processes it, and stores it in memory. After these steps are taken by the control computer, the analog-to-digital converter is reenabled and the data acquisition process begins again.

Control computer 50, a PC compatible computer, is the heart of antenna parameter monitoring system 10. Its purpose is to control all system functions by running a program 50', called grossr.com, which is essentially a continuous loop. Operation of the program begins with the downloading of essential operating information from an external data storage file. After downloading the external operating data, the program goes into a data collection and storage loop. In this mode the program performs a continuous loop of (1) downloading data from analog-to-digital converter 40 after a trigger signal 30' has initiated the data acquisition; (2) processing the data to extract the RMS, root mean square, antenna voltage, RMS antenna current, cosine, and sine of the phase angle between the voltage and current; (3) storing the processed data in a computer file; (4) waiting a fixed period of time; (5) and resetting the analog-to-digital converter and waiting for the next set of samples to be taken. It typically takes about one second to perform the preceding four steps so antenna parameter monitoring system 10 can monitor the antenna parameters as fast as once every second.

A flow chart of the program operation referred to above is shown in FIGS. 6a, 6b, 6c and 6d. The operation shown in FIG. 6a sets forth the preliminary steps which are to be performed by the program of Appendix A before the blocks of sample signals are operated on at G in the FIGS. A description of the computer calculation of the circuit parameters is given below.

Figure 5A:
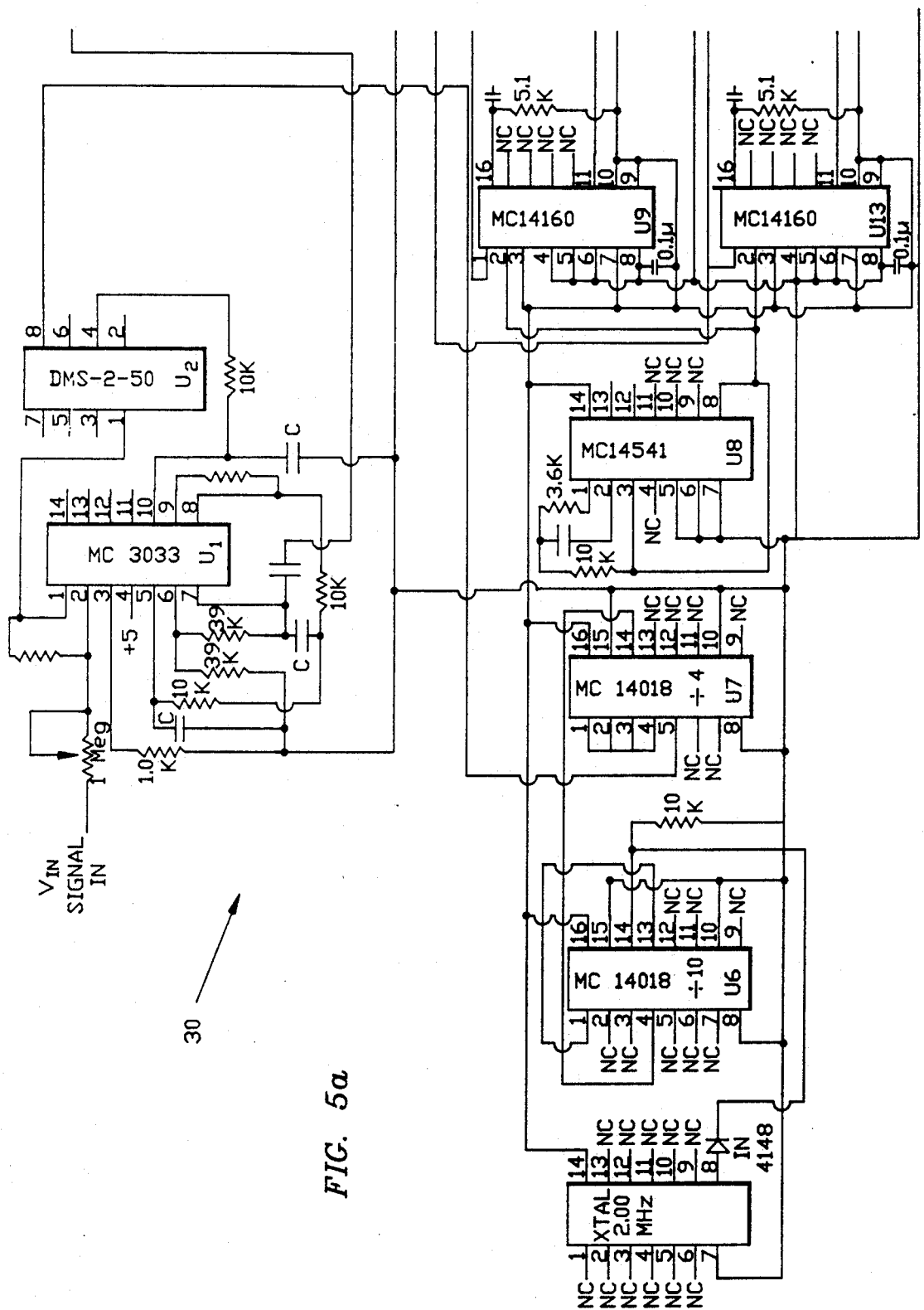
FIGS. 5a and 5b depict a circuit diagram of the trigger circuit implementation.
Figure 5B:
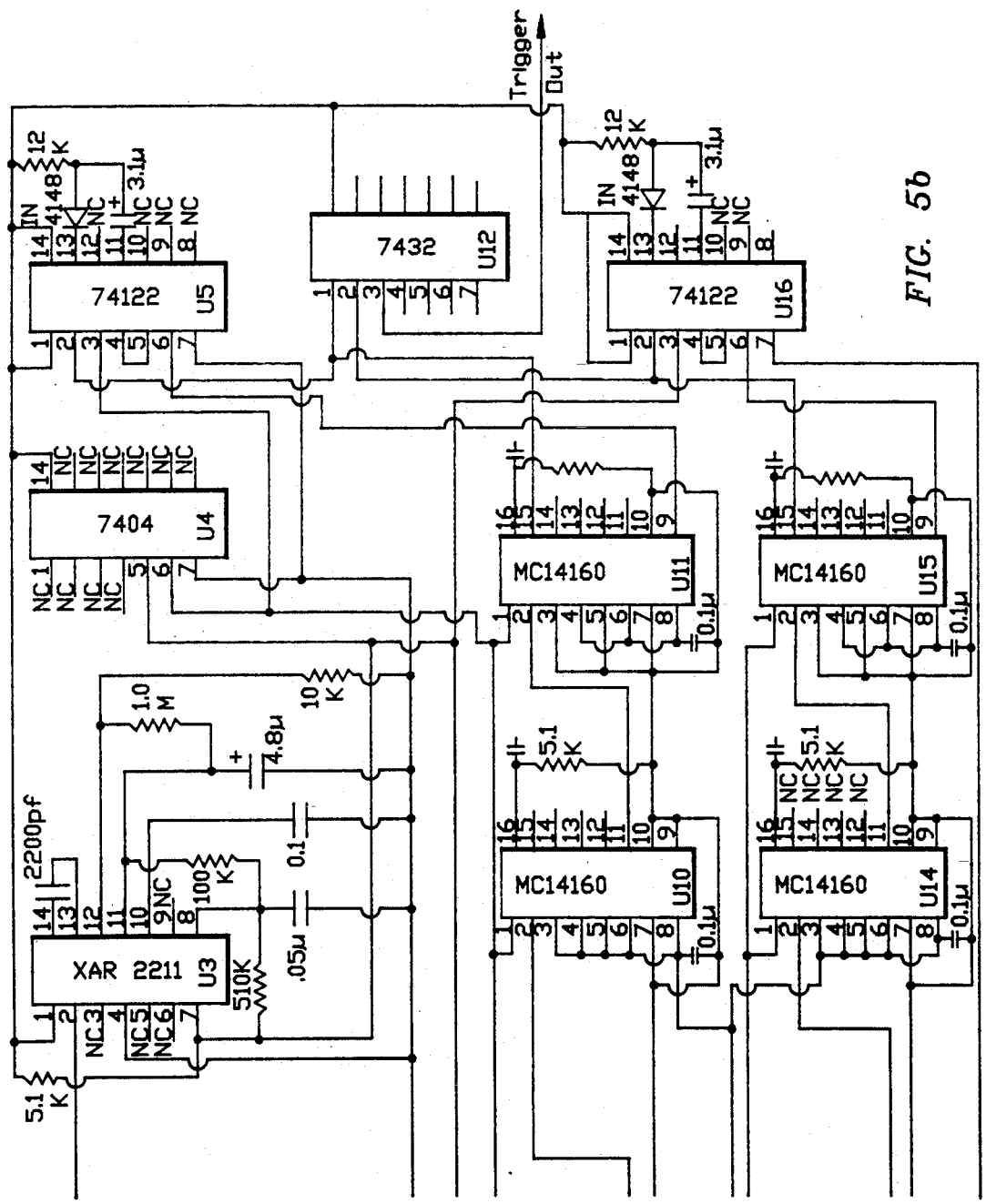
Figures 6A, 6B:
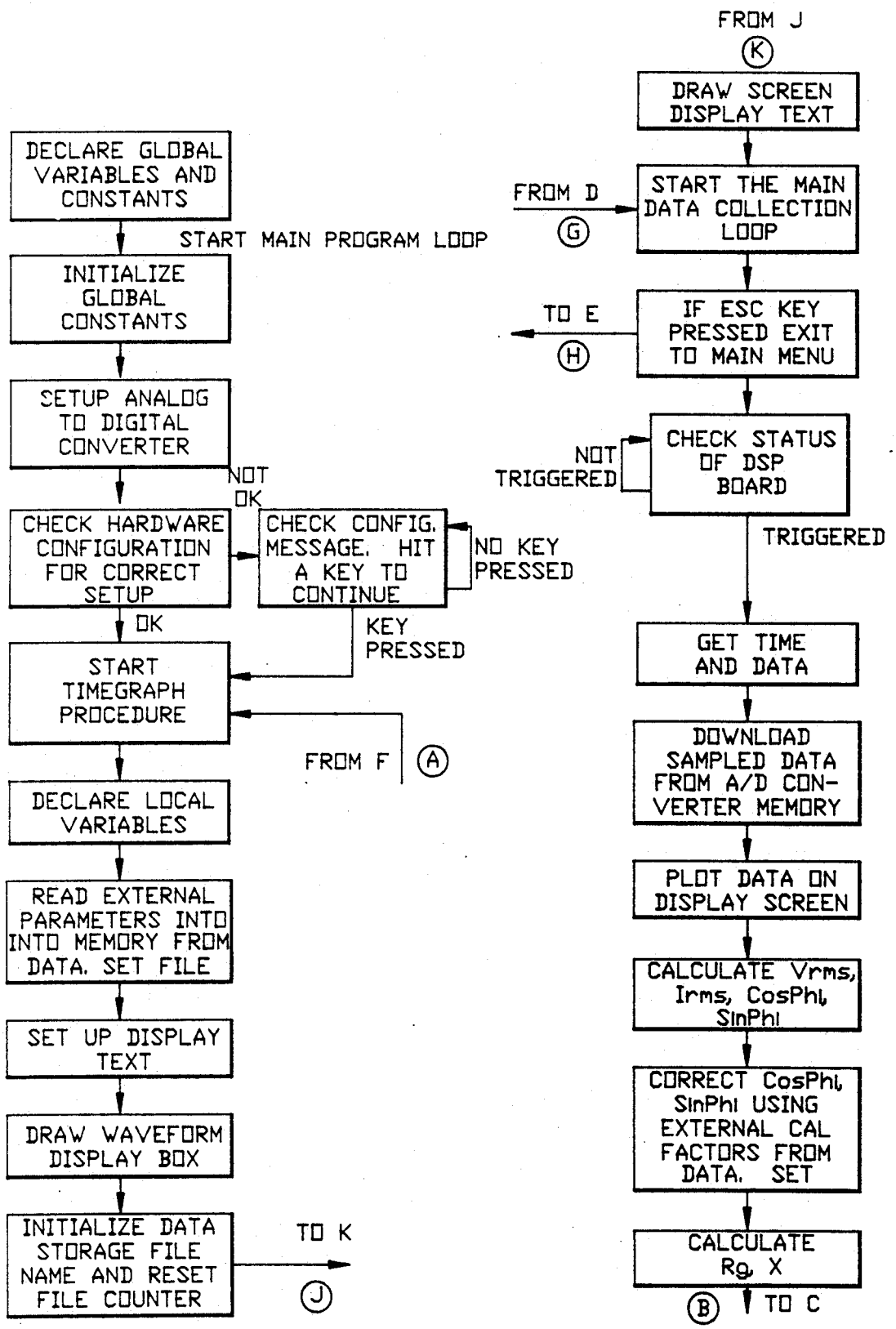
FIGS. 6a, 6b, 6c and 6d set forth an operational representation of the software flow chart of this inventive concept.
Figure 6D:
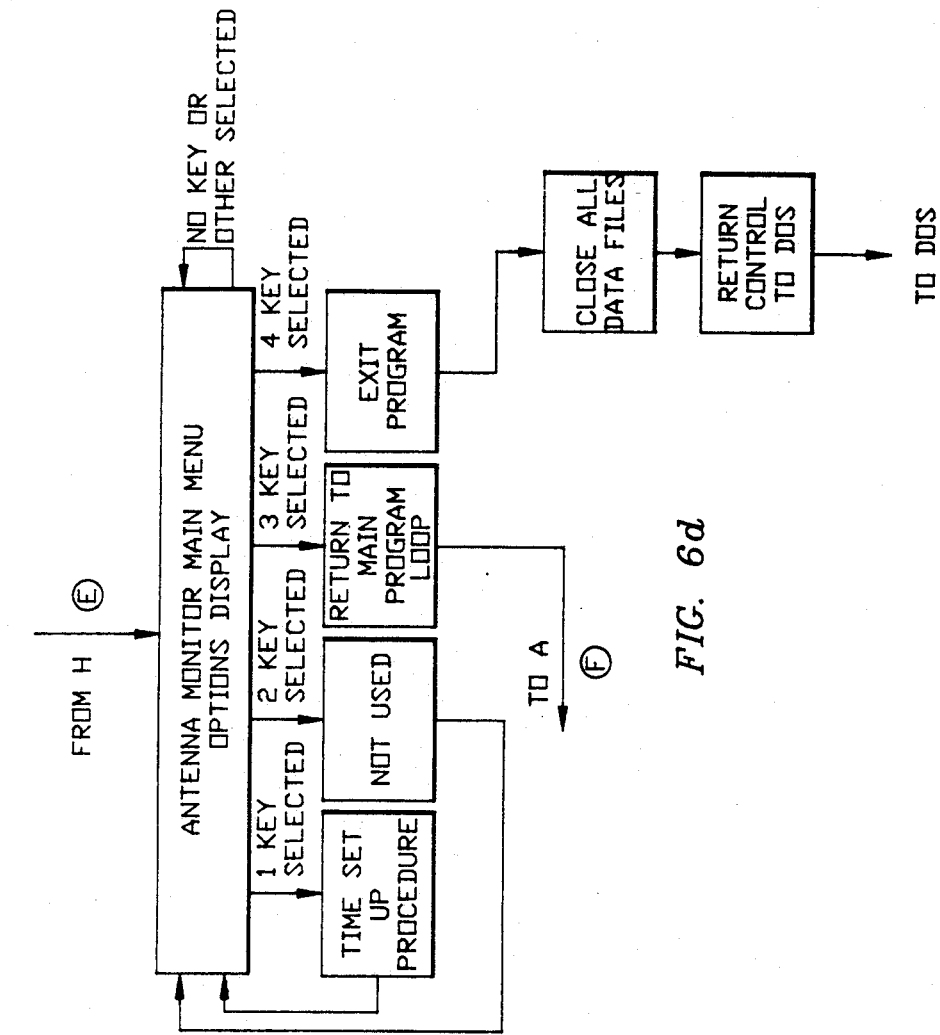
Figure 6C:
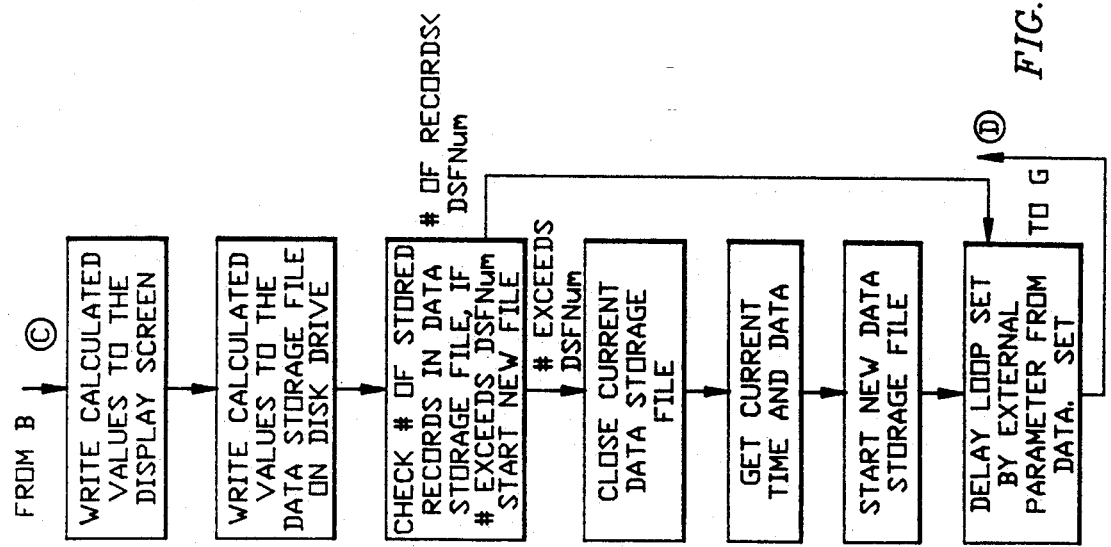

As described above, trigger circuit section 30 detects each time the modulated signal changes frequency $B_{OUT}$ (which represents a bit change directly in FSK and indirectly in MSK modulation). Referring once again to trigger circuit section block diagram of FIG. 4 and the detailed schematic of an implementation of the trigger circuit of FIGS. 5a and 5b, the trigger circuit operates by first buffering the input signal $V_{IN}$ with an op-amp buffer amplifier 32 then mixing 33 the buffered signal down to an intermediate frequency of 5 Khz with a local oscillator LO. The LO frequency is set to provide a difference of 5 Khz between its own frequency and the carrier frequency of $V_{IN}$. The mixer output is followed by a low pass filter 34 to remove the higher frequency product terms from the mixer output. The filtered signal is then fed to the frequency-to-voltage converter 35 which converts the IF signal to baseband $B_{OUT}$. This baseband digital signal is then used to start two banks of presettable counters 31a and 31b which are set based on the settling time of the particular antenna system. The counters are clocked with a 10 KHz clock generated by a local 10 KHz oscillator 31c and counter bank 31a operates on the high (mark) frequency transitions while counter bank 31b operates on the low (space) frequency transitions. If either bank of the counters counts down the desired settling time before another bit transition occurs, one-shot trigger 31d or 31e outputs a trigger pulse 30' which is then sent to analog-to-digital converter 40.

As previously described, control computer 50 may be an IBM PC compatible computer which is operated entirely by a master program 50' which provides both control of the various system functions and implementation of the parameter calculation algorithms described in the following paragraphs. This master program consists of approximately 2000 lines of code written in the Turbo Pascal programming language, version 3. A complete listing of the current version of computer program 50' is included in Appendix A.

Operation of the program begins with the downloading of essential operating information from an external data storage file. After downloading the external operating data, the program goes into a data collection and storage loop. In this mode, the program performs a continuous loop of (1) downloading data from analog-to-digital converter 40 after a trigger signal 30' has initiated the data acquisition; (2) processing the data to extract the RMS antenna voltage, RMS antenna current, cosine, and sine of the phase angle between the voltage and current; (3) storing the processed data in a computer file; (4) waiting a fixed period of time; (5) and resetting analog-to-digital converter 40 and waiting for the next set of samples to be taken. It typically takes about one second to perform the four steps described above on an IBM AT compatible computer. At this rate, antenna parameter monitoring system 10 can monitor the antenna parameters as fast as once every second if desired to give the near real time capability. The rate of sample taking is controllable by data stored in the external data file. In addition, this file contains other program parameters such as the size of the monitored data storage file and calibration factors.

A flow chart of the overall program operation is shown in FIGS. 6a, 6b, 6c and 6d and a description of the computer algorithms of Appendix A used to calculate the individual circuit parameters is given as follows.

However, first, an encapsulation of the foregoing procedure may be helpful. Antenna parameter monitoring system 10 relies on a trigger circuit 30 which constantly monitors the antenna system voltage from antenna sensing section 20 that provides blocks of sample signals. The trigger circuit section provides an output signal which enables an analog-to-digital converter 40 to take a block of samples when, first of all, the analog-to-digital converter has been enabled by a computer 50 after the computer is ready to download samples, and secondly, when the trigger circuit provides an output indicating that a steady state condition has been reached. The steady state condition on the initial run through a delay loop of the system has been determined by the trigger circuit, which then outputs a triggering pulse when it has determined that the system is in the pseudo-steady state condition. When this happens, the analog-to-digital converter takes a block of samples. As soon as that block of samples has been taken, a monitor (from the computer, which continuously monitors the state of the analog-to-digital converter), determines that a block of samples has been taken and subsequently downloads that block of data samples. At the same time the analog-to-digital converter is put on hold until the computer is finished with its processing.

Once the data has been downloaded to the computer in accordance with the abovedescribed sequence, it runs through the following series of algorithms to determine the antenna feed-point voltage, antenna current, gross resistance, gross reactance and steady-state phase angle between the voltage and current.

The purpose of antenna parameter monitoring system 10 is to provide indications of the antenna parameters Rg, Lg, Cg, Vant, and Iant, (see FIG. 1) as well as the sine and cosine of the steady state phase angle between the antenna voltage and current. The following set of procedures is relied upon by computer 50 appropriately operated upon with control and calculation software 50' (see Appendix A) to arrive at these parameters.

Given a VLF or LF antenna tuning system, as shown in FIG. 1, the impedance can be written as, $$Zant = \frac{Vant}{Iant} = Rg + jX(\omega) \tag{1}$$

Where $X(\omega)$ is the reactance, which is a function of the driving frequency $\omega$. Alternately, the steady state antenna voltage and current can be expressed as, $$Vant(t) = Vm \cdot \cos(\omega t) \tag{2}$$

$$Iant(t) = Im \cdot \cos(\omega t - \phi) \tag{3}$$

Where,
Vm = Maximum Instantaneous Antenna Voltage
Im = Maximum Instantaneous Antenna Current
$\phi$ = Steady State Phase Angle Between Voltage and Current Two of the desired antenna parameters, Rg and $X(\omega)$, are expressed as, $$Rg = \frac{Vm}{Im} \cdot \cos(\phi) \tag{4}$$

$$X(\omega) = \frac{Vm}{Im} \cdot \sin(\phi) \tag{5}$$

Equations 4 and 5 assume that the circuit is being driven by a steady state sinusoidal voltage at a frequency $\omega$, which gives rise to a steady state current response at the same frequency $\omega$ and with a phase angle of $\phi$ relative to the voltage signal. This is the same as the pseudo steady state the circuit will be in when triggered by the previously described trigger circuit. The peak voltage, Vm, and the RMS voltage Vrms are related as, $$Vrms = \frac{Vm}{\sqrt{2}}$$

Since it is easier to calculate the root mean squared (RMS) values of the voltage and current, labeled Vrms and Irms, these will be calculated rather than Vm and Im. If the circuit is in the pseudo state condition the RMS voltage, Vrms, is, $$Vrms = \left[ \frac{2}{kT} \cdot \int_0^{\frac{kT}{2}} [Vant(t)]^2 dt \right]^{\frac{1}{2}} \tag{6a}$$

or, $$Vrms = \left[ \frac{2}{kT} \cdot \int_0^{kT/2} [Vm \cdot \cos(\omega t)]^2 dt \right]^{\frac{1}{2}} \tag{6b}$$

Where,
T = transmitted signal period = $2\pi/\omega$
k = Integer $\neq$ 0
Likewise, Irms can be written as, $$Irms = \left[ \frac{2}{kT} \cdot \int_0^{kT/2} [Im \cdot \cos(\omega t - \phi)]^2 dt \right]^{\frac{1}{2}} \tag{7}$$

If the voltage and current signals are sampled at or above the Nyquist rate using a sample rate of Ts, the j samples of the voltage and current are, $$Vs[iTs] = Vm \cdot \cos(\omega iTs) \tag{8}$$

$$Is[iTs] = Im \cdot \cos(\omega iTs - \phi) \tag{9}$$

i = 1, 2, ... j

The approximations of Vrms and Irms using the samples are given as, $$\hat{V}rms = \left( \frac{1}{j} \cdot \sum_{i=1}^{j} Vs^2[iTs] \right)^{\frac{1}{2}} \tag{10}$$

$$\hat{I}rms = \left( \frac{1}{j} \cdot \sum_{i=1}^{j} Is^2[iTs] \right)^{\frac{1}{2}} \tag{11}$$

Where
$\hat{V}$rms is the estimate of Vrms
$\hat{I}$rms is the estimate of Irms

And the j samples are taken over an integer number of half periods of the voltage and current signals.

The cosine of the phase angle between the voltage and current can be approximated as, $$\hat{\cos}(\phi) = \frac{1}{j} \cdot \left[ \sum_{i=1}^{j} \frac{Vs[iTs] \cdot Is[iTs]}{\hat{V}rms \cdot \hat{I}rms} \right] \tag{12}$$

And from equation (4) using the estimated Vrms, Irms and $\cos(\phi)$ values, gross resistance is given $$\hat{R}g = \frac{\hat{V}rms}{\hat{I}rms} \cdot \hat{\cos}(\phi) \tag{13}$$

The sign of the phase angle can be estimated by correlating it with an estimate of the derivative of the voltage signal as $$\frac{d\hat{\imath}(iTs)}{dt} = C_d \cdot (Is(iTs - 1) - Is(iTs + 1)) \tag{14}$$

Using this estimate of the derivative of the voltage signal, it follows, $$\hat{\sin(\phi)} = \frac{-1}{j} \cdot \left[ \sum_{i=1}^{j} \frac{V_s(iT_s) \cdot \frac{d\hat{I}(iT_s)}{dt}}{\hat{V}_{rms} \cdot \hat{I}_{rms}} \right] \quad (15)$$

Where $C_d$ is a differentiator constant which is a function of $\omega$, i.e., $$C_d = \frac{1}{2 \cdot \sin(\omega \cdot T_s)} \quad (16)$$

The estimated reactance, $X(\omega)$ is then, $$X(\omega) = \frac{\hat{V}_{rms}}{\hat{I}_{rms}} \cdot \sin(\phi) \quad (17)$$

Now, having the equations and logic sequence as set forth above, and, at this point, it is assumed that the data has been downloaded from analog-to-digital converter 40 into a array in computer 50. What happens next is, the computer goes through a sequence of signal transforming procedures to arrive at a determination of the various parameters.

The first antenna parameter that is determined by computer 50 is the antenna feedpoint voltage, antenna RMS voltage value, that is described above as equation (10) which is determined in accordance with the instructions lines of Appendix A. After determination of the RMS voltage computer 50 determines the RMS antenna current of equation (11) which is determined in accordance with the instructions of Appendix A. After finding the current value computer 50 formulates the solid-state phase angle between the RMS voltage and the RMS antenna current, or, rather a function of the phase angle, the cosine of the phase angle, from that same block of samples from analog to digital converter 40 using equation (12) which is determined in accordance with the instructions of Appendix A. Finally, to find the sine of the phase angle it makes a calculation based on equation (15) which is determined in accordance with the instructions of Appendix A. and a constant is determined from equation (16) which is determined in accordance with the instructions of Appendix A.

After calculating these fundamental parameters, the computer then stores these values, along with the date and time that the information was taken, and simultaneously writes the values to a display on the computer screen: the value of the voltage, the current, phase angle, and, in addition, the gross resistance, which is calculated from the voltage and current values given by equation (13) which is determined in accordance with the instructions of Appendix A.

In other words, the voltage, current and phase angle between the voltage and current is a consequence of operation select ones of the computer instructions of software 50' on computer 50 in the execution of the equations (10), (11), (12), and (15).

The primary parameters, the RMS voltage, current and phase angle between them are used to calculate several other antenna parameters. The system determines RMS voltage, current, cosine and sine of the phase angle as mentioned above, from equations (10), (11), (12) and (15). From these values several other antenna parameters are provided. The first one is the antenna system gross resistance, which is shown in equation (13). It is simply the RMS voltage divided by the RMS current times the cosine of the phase angle between them. That parameter is determined and displayed on the computer monitor screen.

After these equations have been operated on by the computer, the antenna system then goes into a delay loop that is programmed into the system. The delay loop is simply the amount of time that program 50' waits until it is ready to take the next block of samples so that the program goes through that delay loop. When that time has run out, the program, operating on computer 50, re-enables analog-to-digital converter 40 and continues to queue it until the computer has been triggered by triggering circuit 30 and takes a new block of samples, as it was described at the beginning of the operation. The normal operation thus continues to run through the loop until it is turned off by an operator.

From the above it is apparent that antenna parameter monitoring system 10 contains a computer program 50' which operates in computer 50 which directly determines the desired entities of equations 10, 11, 12, 13, 14, 15, 17, 20, and 21 using the sampled data values obtained from analog-to-digital converter 40.

Having obtained the parameter values in the aforedescribed manner, an operator is confident of the validity of the received data. The near real time ongoing analysis provides an effective alert to avoid the problems associated with faulty data and unreliable equipments. The near real time ongoing analysis also gives the technical personnel an indication of changes in the identified parameters so that anticipatory modifications and repairs can be undertaken prior to any meaningful compromise of the transmitting antenna and interconnected components.

Obviously, many modifications and variations of the present invention are possible in light of the above teachings. Therefore, it is to be understood that within the scope of the appended claims, the invention may be practiced otherwise than as specifically described.

```
PROGRAM GrossR;
{$U-,C-}

{++++++++++++++++++++++++++++++++++++++++++++++++++++++++++++++++++}
{                                                                  }
{                        PROGRAM GROSSR.PAS                        }
{                                                                  }
{            Written by,                                           }
{               Steven C. Tietsworth                               }
{               Naval Ocean Systems Center, Code 832               }
{               San Diego, California 92152-5000                   }
{                    (619) 553-4199                                }
{                                                                  }
{               Version 1.0  9/1/1989                              }
{                                                                  }
{    NOTE:   THIS PROGRAM HAS BEEN DEVELOPED WITH PARTS OF         }
{            THE PROGRAM R370D.PAS, WRITTEN AND COPYWRITE          }
{            1988 by RAPID SYSTEMS, INC.                           }
{                                                                  }
{++++++++++++++++++++++++++++++++++++++++++++++++++++++++++++++++++}

TYPE
       Str4          = STRING[4]                       ;
       Str36         = STRING[36]                      ;
       Dat2          = ARRAY[0..1]      OF BYTE        ;
       Dat_2         = ARRAY[0..1]      OF INTEGER     ;
       Dat5          = ARRAY[0..4]      OF BYTE        ;
       Dat512        = ARRAY[1..512]    OF BYTE        ;
       Dat1024       = ARRAY[0..1023]   OF BYTE        ;
       Dat1024_I     = ARRAY[1..1024]   OF INTEGER     ;
       gainstrtype   = ARRAY[0..11]     OF STRING[6]   ;
       timestrtype   = ARRAY[0..23]     OF STRING[7]   ;
       chanstrtype   = ARRAY[0..1]      OF CHAR        ;
       tmodestrtype  = ARRAY[0..12]     OF STRING[12]  ;
       xtypestrtype  = ARRAY[0..1]      OF STRING[9]   ;
       ontype        = ARRAY[0..1]      OF STRING[3]   ;
       scaletype     = ARRAY[0..1]      OF STRING[10]  ;
       iotype        = ARRAY[0..1]      OF STRING[8]   ;
       Cal_Array_Type = ARRAY[0..1]     OF INTEGER     ;
       Zero_Type     = ARRAY[0..1]      OF REAL        ;
       typeave       = ARRAY[0..1]      OF STRING[8]   ;

CONST
       gainstr  : gainstrtype = ('.256 V', '.512 V', '1.28 V', '2.56 V',
                                 '5.12 V', '12.8 V', '25.6 V', '51.2 V',
                                 '128 V ', '256 V ', '512 V ', '1280 V' );

timestr  : timestrtype = ('1 Hz   ','2 Hz   ','5 Hz   ','10 Hz  ',
                                 '20 Hz  ','50 Hz  ','100 Hz ','200 Hz ',
                                 '500 Hz ','1 kHz  ','2 kHz  ','5 kHz  ',
                                 '10 kHz ','20 kHz ','50 kHz ','100 kHz',
                                 '200 kHz','500 kHz','1 MHz  ','2 MHz  ',
                                 '5 MHz  ','10 MHz ','20 MHz ','Ext Clk' );

chanstr  : chanstrtype = ( 'A', 'B' ) ;
       tmodestr : tmodestrtype = ('Automatic   ','Analog Ch A ',
                                  'Analog Ch B ','            ',
                                  '            ','Analog Ext  ',
                                  '            ','Digital A + ',
                                  'Digital B + ','            ',
                                  '            ','Digital A - ',
                                  'Digital B - ');

xtypestr : xtypestrtype = ( 'Decimated', 'Averaged ' );
       onstr    : ontype      = ( 'Off' , 'On ' ) ;
       scalestr : scaletype   = ( 'Full Range' , 'Compressed' ) ;
       iostr    : iotype      = ( 'Standard' , 'R300    ' );
       typavg   : typeave     = ( 'Multiple' , 'Single  ' );
```

```
    forever     : BOOLEAN = FALSE ;
    Cursor      : INTEGER = 128    ;
    Linear      : BYTE    = 0      ;
    NoDisplay   : BYTE    = 0      ;
    IBMEGA      : BYTE    = 2      ;
    IBMCGA      : BYTE    = 1      ;
    GainNum     : ARRAY[0..11] OF Real = ( 0.128, 0.256, 0.64, 1.28, 2.56,
                                           6.4, 12.8, 25.6, 64.0, 128.0,
                                           256.0, 640.0 );

VAR
    Gain                    : Dat2       ;  { 0 .. 1 contain Ch Gain index    }
    Offset                  : Dat_2      ;  { 0 .. 1 contain Ch Plot Offset   }
    Calibration             : Dat_2      ;  { 0 .. 1 contain Ch DC offset cal}
    Status                  : INTEGER    ;  { Updated by Setup_20M, Go,       }
                                            { Get_Status, or Xfer_20M_Data    }

PreProcessMode,
    TypAve,
    Count                   : INTEGER    ;  { Plot Count from Xfer_20M_Data   }
    Compress                : INTEGER    ;  { Decimation from Xfer_20M_Data   }
    Grid                    : BYTE       ;  { 0=grid off, 1=grid on           }
    P_Type                  : BYTE       ;  { 0= Linear, 1= Log, 2&4= Cmplx   }
    T_Type, Scale           : BYTE       ;  { Trigger Type; 0 .. 14,          }
    Mask                    : BYTE       ;  { Plot Channel Mask 1=A,2=B..8=D  }
    ConNum                  : BYTE       ;  { Tests for 128 K option          }
    Level                   : BYTE       ;  { Digital Trigger Level           }
    Rate                    : BYTE       ;  { Acquisition Rate                }
    Screen                  : BYTE       ;  { Screen Display Rate             }
    Errcode                 : BYTE       ;
    mkey,
    Selection,Ch            : CHAR       ;
    CursorSet               : Boolean    ;
    Zero                    : Zero_Type  ;
    IO_Type                 : BYTE       ;  { Interface type; 0=std,1=R320    }
    Base                    : INTEGER    ;  { Base address for R320 Board     }
    mgain,
    maxbuffersize           : REAL       ;
    Pre                     : REAL       ;
    Post                    : REAL       ;
    Pos_O                   : INTEGER    ;  { Position for Display  ReTrigger}
    Pos_B                   : INTEGER    ;
    Position                : REAL       ;
    X_Type                  : BYTE       ;  { Transfer type;0=decimated,1=ave}
    Start                   : INTEGER    ;  { Start plot index                }
    stdnld,findnld,
    wrmsb,wrlsb             : INTEGER    ;
    rdtms,rdtmsst,
    wrdop,strbdw            : INTEGER    ;
    rddop,MagData           : INTEGER    ;
    DisplayType,i,t         : BYTE       ;
    Cal_Type                : BYTE       ;
    Cal_Array               : Cal_Array_Type ;
    Cal_Status              : BYTE       ;
{--------------------------------------------------------------------------}
{                    NOSCINFO PROCEDURE                                    }
{    This procedure is called to write the NOSC program label              }
{    and program version number on the display screen.                     }
{                                                                          }
{              Version 1.0   by S.C.T.   5/10/89                           }

PROCEDURE NOSCINFO ;

BEGIN
     GoToXY ( 20,25 ) ;
     Write ('NOSC Antenna Monitor System    Version 1.0') ;
   END ;    { Procedure NOSCINFO }
{--------------------------------------------------------------------------}
```

```
{                   HardwarePresent FUNCTION                           }
{ This function tests for the presence and type of graphic             }
{ display and monitor used by the computer that the program            }
{ is being run on.                                                     }
{                                                                      }
{              Version 1.0    by R.S.                                  }

FUNCTION HardwarePresent:Boolean;

VAR
     I,EquipFlag        : Integer;
     Info,EGASwitch     : Byte;
     HP                 : Boolean;

regs:RECORD CASE Integer OF
      1:(ax,bx,cx,dx,bp,si,di,ds,es,flgs:Integer);
      2:(al,ah,bl,bh,cl,ch,dl,dh:Byte);
      END;

BEGIN
      HP := False;
      DisplayType := NoDisplay;

WITH regs DO

BEGIN
         Intr($11,regs);
         EquipFlag:=AX;
         ah:=$12;
         bl:=$10;
         Intr($10,regs);
         EGASwitch:=CL;
         Info:=BH;
      END;

IF ((EquipFlag AND 52) IN [0,16,32]) AND (Info=0) THEN

BEGIN   { EGA PRESENT, ACTIVE, AND IN COLOR }
         DisplayType:=IBMEGA;
         HP:=True;
      END;

IF NOT HP THEN

IF ((EquipFlag AND 52=36) AND (Info=0) AND (EGASwitch = 8)) THEN

BEGIN   { CLONE EGA PRESENT, CGA MODE 640x200 B&W }
         DisplayType:=IBMEGA;
         HP:=True;
      END;

IF NOT HP THEN
   IF ((EquipFlag AND 48) IN [16,32]{ CGA }) OR
      (((EquipFlag AND 52)=4{ EGA BUT NOT ACTIVE }) AND
      (EGASwitch IN [4,5,10,11]){ EGA IS MONO, CGA FOR COLOR }) THEN BEGIN
         DisplayType:=IBMCGA;
         HP:=True;
      END;

HardwarePresent:=HP;

END;       { Function HardwarePresent }
```

```
{----------------------------------------------------------------------}
{                       ClrOne PROCEDURE                               }
{    This procedure is used to clear a line by writing a string        }
{    of blank text 72 spaces long to the desired line                  }
{                                                                      }
{            Version 1.0    by   R.S.                                  }

PROCEDURE ClrOne;

TYPE
      ClrType = String[79] ;

CONST
      ClrText : ClrType = '

BEGIN
      GoToXY(1,1)        ;
      Writeln(ClrText);
      GoToXY(1,1)        ;
   END;    { Procedure ClrOne }
```

```
{----------------------------------------------------------------------}
{                     Download PROCEDURE                               }
{    This procedure reads a TMS32010 loadable file as generated        }
{    by the TMS Assembler and Linker Tools available from Texas        }
{    Instruments                                                       }
{                                                                      }
{    The Following Error Codes are Returned:                           }
{       0 - no Errors                                                  }
{       1 - specified file is too long (more than 4096 words)          }
{       2 - specified file does not start at address zero              }
{       3 - specified file is relocatable                              }
{       4 - specified file is not Texas Instruments format             }
{                                                                      }
{            Version 1.0   by  R.S.                                    }

PROCEDURE Download (        fname      : str36 ;
                        VAR errcode    : BYTE     );
   VAR
      tmsfile            : TEXT ;
      char4              : STRING[4] ;
      char5              : STRING[5] ;
      obj                : ARRAY[0..4095] OF INTEGER ;  { tms object code }
      dummy, keychar     : CHAR ;
      objsize, i, code   : INTEGER ;

BEGIN
      CLRSCR ;
      ASSIGN(tmsfile, fname) ;
      GoToXY(26,12);
      Write('LOADING FILE "',Fname,'"');
```

```
RESET(tmsfile) ;

{ now we skip past the file id if there is one }

READ (tmsfile, Dummy) ;        { read control char from file }
IF Dummy = 'K' THEN FOR i := 1 to 12 DO READ(tmsfile, dummy) ;
WHILE Dummy <> '9' DO READ(tmsfile, dummy) ;
i := 0 ;           { init index into object code array }
READ(tmsfile, char4) ;
IF char4 <> '0000' THEN BEGIN
      CLOSE(tmsfile) ;
      errcode := 2 ;
      EXIT ;
   END;

READ (tmsfile, keychar) ;      { read control char from file }
WHILE ( keychar <> ':' ) DO    { not at end of file }

BEGIN
     IF i > 4095 THEN

BEGIN
          CLOSE(tmsfile) ;
          errcode := 1 ;
          EXIT ;
       END ;

WHILE   ( keychar <> '7' ) DO           { not at end of line }

BEGIN
        IF ( keychar <> 'B' ) THEN

BEGIN
             CLOSE(tmsfile) ;
             errcode := 3 ;
             EXIT ;
           END;

READ(tmsfile, char4) ;         { read 4 char word }
        char5 := '$' + char4 ;
        VAL(char5, obj[i], code) ;     { convert to integer }
        IF code<> 0 THEN BEGIN
             CLOSE(tmsfile) ;
             errcode := 4 ;
             EXIT ;
           END ;

i := i+1 ;
        READ (tmsfile, keychar) ;      { get next control char }
      END ;

READLN (tmsfile) ;               { skip to next line }
      READ (tmsfile, keychar) ;        { get next control char }
      IF keychar = '9' THEN            { begin add'l data }

BEGIN
            READ(tmsfile, char4) ;     { read 4 char word }
            READ (tmsfile, keychar) ;  { and new key char }
         END;

END ;

CLOSE(tmsfile) ;
   objsize := i ;
   PORT[stdnld] := 0 ;                 { start download }
   FOR i:=0 TO objsize-1 DO
```

```
              BEGIN
                PORT[wrmsb] := HI( obj[i] ) ;
                PORT[wrlsb] := LO( obj[i] ) ;
              END ;

PORT[findnld] := 0 ;

END ;   { Procedure Download }
```

{-----------------------------------------------------------------------------}

```
    {                    Offset_Calc PROCEDURE                              }
    {     This procedure is used to compute addresses from the base.        }
    {                                                                       }
    {              Version 1.0    by   R.S.                                 }

PROCEDURE Offset_Calc;

BEGIN stdnld   := Base+0;
             findnld  := Base+1;
             wrmsb    := Base+2;
             wrlsb    := Base+3;
             rdtms    := Base+3;
             rdtmsst  := Base+2;
             rddop    := Base+4;
             wrdop    := Base+4;
             strbdw   := Base+6;

END;    { Procedure Offset_Calc }
```

{-----------------------------------------------------------------------------}

```
    {                        Value PROCEDURE                                }
    {     This procedure returns the index for the maximum and              }
    {     minimum values in an array of variables of type Byte.             }
    {                                                                       }
    {              Version 1.0    by   R.S.                                 }

PROCEDURE Value ( VAR Buff              : Dat512;
                          VAR MinIndex,MaxIndex : INTEGER );

VAR
             Count    :INTEGER ;
             Min,Max  : BYTE ;

BEGIN
             Min:= 255;
             Max:= 0  ;
             FOR Count:= 1 TO 512 DO BEGIN
                  IF Buff[Count] < Min THEN
```

```
            BEGIN
              Min:= Buff[Count];
              MinIndex:=Count
            END;

IF Buff[Count] > Max THEN

BEGIN
              Max:= Buff[Count];
              MaxIndex:=Count
            END;

END;

END;     { Procedure Value }
```

{------------------------------------------------------------------------}

```
{                      getkey FUNCTION                                   }
{    This function scans the keyboard.                                   }
{                                                                        }
{              Version 1.0    by R.S.                                    }

FUNCTION getkey : CHAR ;

TYPE
     Regpack = RECORD
       CASE BOOLEAN OF
         TRUE :(AX, BX, CX, DX, BP, SI, DI, DS, ES, FLAGS : INTEGER) ;
         FALSE:(AL, AH, BL, BH, CL, CH, DL, DH            : BYTE   ) ;
       END ;

VAR
     Regs    : RegPack ;

BEGIN
     WITH regs DO

BEGIN
          AH := $06 ;
          DL := $FF ;
          MSDOS(Regs) ;
          getkey := CHR(AL) ;
        END ;

END;   { Function getkey }
```

{------------------------------------------------------------------------}

```
{                   Plot_Time PROCEDURE                                  }
{    This procedure is used to plot the waveform stored in the           }
{    data buffer to the display screen.  The variable Mask is a          }
{    bit mask for the active channel to be plotted where a 1             }
{    represents channel A, a 2 channel B, and 3 represents both          }
{    channels.  Plot_Time requires a data buffer which is 2 back         }
{    to back 512 byte areas in one buffer dimensioned 1024.              }
{    Num_Pix is the number of pixels to plot; usually 512.               }
{    P_Type is a value of either 0=Linear Plot or 1=Log Plot.            }
{    Offset is an array of Channel Display Offset values -192..0..192.   }
{    If Clear is true the last plot is cleared as the plot is done;      }
{    else the last plot and this are ORed.                               }
{    This Plot routine compatible with CGA 640x200 mode only.            }
{                                                                        }
{              Version 1.0    by  R.S.                                   }
```

```
    PROCEDURE Plot_Time (VAR Buffer      : Dat1024;
                         VAR Offset      : Dat_2;
                         VAR Calibration : Dat_2;
                             Start       : Integer;
                             Grid        ,
                             Sca'        ,
                             Ma..        : Byte;
                             Row         ,
                             Col         ,
                             Count       : Integer;
                             Chan_History: Integer;
                             Clear       : Byte        );
    EXTERNAL 'PLOT.BIN' ;
```

{------------------------------------------------------------------}

```
{                    Time_Setup PROCEDURE                          }
{ This procedure is used to start the grossr program by            }
{ providing a display screen with Grossr program setup             }
{ options such as voltage ranges for the A/D converter,            }
{ sampling rates, and internal calibration.  When the program      }
{ is initially started, this menu comes up and prompts             }
{ the user to select one of the available options.                 }
{                                                                  }
{         Version 1.0    by    R.S.                                }
{         Version 2.0    by    S.C.T.    5/20/89                   }
{           Modified the procedure to eliminate options            }
{           that are not needed and to add the Grossr              }
{           program start option                                   }

PROCEDURE Time_Setup ( VAR Gain    : Dat2    ;
                           VAR Rate    ,
                               Screen  ,
                               T_Type  ,
                               IO_Type ,
                               Mask    : BYTE    ;
                           VAR Pre     ,
                               Post    : REAL    ;
                           VAR Base    : INTEGER   );

VAR
       selection : CHAR   ;
       temp,temp1: REAL   ;
       i,t       : BYTE   ;

BEGIN
      REPEAT
        CLRSCR;
        WRITELN;
        WRITELN ( 'Time Series Setup Options'                       ) ;
        WRITELN;
        FOR i := 0 to 1 DO
        WRITELN ( ' ', i + 1 , ') Input voltage range for Ch ',
                  ChanStr[ i ],' = ' , gainstr[ Gain[ i ] ]          ) ;
        WRITELN (' 3) Sample Rate                     = ',
                    timestr[ Rate ]                                  ) ;
        WRITELN ( '  4) Trigger Mode                   = ',
                    tmodestr[ T_Type ]                               ) ;
        WRITELN ( '  5) Pre Trigger Count              = ',
                    Pre:6:0                                          ) ;
        WRITELN ( '  6) Post Trigger Count             = ',
                    Post:6:0                                         ) ;
```

```
WRITELN ( '  7) Interface Type             = ',
              iostr[IO_Type]                         ) ;
WRITELN ( '  8) Interface Base Address     = ',
              Base                                   ) ;

GoToXY(3,15);
Write('SELECT OPTION 1...8 ');
GoToXY(3,16);
WRITE( '<ESC> or <CR> to Return to Main Menu'        ) ;
NOSCINFO;
READ ( KBD, selection ) ;
CASE selection OF '1' :  BEGIN
            gain[ 0 ] := gain[ 0 ] + 1 ;
            IF gain[ 0 ]>11 THEN gain[ 0 ] := 0 ;
         END ;

'2' :  BEGIN
            gain[ 1 ] := gain[ 1 ] + 1 ;
            IF gain[ 1 ]>11 THEN gain[ 1 ] := 0 ;
         END ;

'3' :  BEGIN
            IF Rate=0 THEN Rate := 23 ;
            Rate := Rate - 1 ;
            Screen := Rate;
         END ;

'4' :  BEGIN
            IF (T_Type=2) or (T_Type=8) THEN
                T_Type := T_Type + 3
            ELSE IF T_Type=5 THEN
                T_Type := 7
            ELSE
                T_Type := T_Type + 1 ;
            IF T_Type>12 THEN T_Type := 0 ;
         END;

'5' :  BEGIN
            ClrScr;
            Temp := Pre ;
            GotoXY(10,11);
            Write( 'Input Pre Trigger Index ( -',
                   maxbuffersize:6:0,'.. 0 ): ' );
            {$I-}
            Buflen := 6 ;
            ReadLn(Pre);
            {$I+}
            IF (IOresult<>0) or (Pre<(0-maxbuffersize))
               or (Pre>0)

THEN Pre := Temp;
            Temp := maxbuffersize+Pre;
            IF Post > Temp THEN Post:=Temp;
         END ;

'6' :  BEGIN
            ClrScr;
            Temp := maxbuffersize+Pre;
            GotoXY(10,11);
            Write( 'Input Post Trigger Index ( 0 ..',
                   Temp:6:0,' ): ' );
            Temp1 := Post ;
            {$I-}
            Buflen := 6 ;
            ReadLn(Post);
            {$I+}
            IF (IOresult<>0) or (Post>maxbuffersize)
               or (Post<0)
            THEN Post := Temp1;
            IF Post > Temp THEN Post := Temp ;
         END ;
```

```
            '7' :   BEGIN
                      IF IO_Type=0 THEN IO_Type:=1
                        ELSE IO_Type:=0;
                    END;

'8' :   BEGIN
                      ClrScr;
                      GotoXY(10,11);
                      Write('Input 20M base address: ');
                      {$I-}
                      Buflen := 3 ;
                      ReadLn(Base);
                      {$I+}
                      IF (IOresult<>0) or (Base<512) or (Base>824) or
                         ((IO_Type=0) and (Base<>$308) and (Base<>$318) and
                          (Base<>$328) and (Base<>$338)) THEN Base:=824;
                    END ;
        END ;

UNTIL selection in [#13,#27,'Q','q'] ;

END ;

{$I GROSSR2.PAS }
```

{---------------------------------------------------------------}

```
{                    GetConfig PROCEDURE                         }
{   This procedure is used to call the external program          }
{   Setup_20M to retrieve setup parameters                       }
{                                                                }
{              Version 1.0     by    R.S.                        }

PROCEDURE Get_Config ( VAR ConNum : BYTE );
     External Setup_20M[18];
```

{---------------------------------------------------------------}

```
{                    MAIN PROGRAM LOOP                           }
{                                                                }
{   This section is the main program loop. It consists of a      }
{   repeating loop that goes to a specific procedure based on    }
{   the user's selection.                                        }
{                                                                }
{                    EDITING HISTORY                             }
{              --------------------------------                  }
{         Version 1.0 by R.S.                                    }
{         Version 2.0 by S.C.T.  8/30/89                         }
{            Removed unnecessary options and modified            }
{            selection menu.                                     }
{         Version 2.1 by S.C.T.  10/17/89                        }
{            Added autostart feature by going directly           }
{            to Timegraph procedure on startup.                  }
{                                                                }
```

```
BEGIN

CursorSet    := FALSE  ;
   IO_Type      := 1      ;
   Base         := 824    ;
   TypAve       := 0      ;

FOR I := 0 TO 1 DO

BEGIN
         Offset[ I ] := 128      ;   { Ch Offset value       }
         Calibration[ I ] := 128 ;
         Zero[ I ] := 128.000    ;
      END;

Gain [0]     := 4      ;   { Set Channel A Gain to 5.12V P-P }
   Gain [1]     := 3      ;   { Set Channel B Gain to 2.56V P-P }
   Cal_Type     := 0      ;
   Count        := 512    ;
   Level        := 128    ;   { Digital Trigger Level }
   Mask         := 3      ;   { Turn On Both Channels }
   T_Type       := 5      ;   { External Trigger      }
   P_Type       := 0      ;   { Plot Type 0 = Linear  }
   Scale        := 1      ;   { Time series xfer scale}
   Position     := 0.0    ;
   Pre          := 0.0    ;
   Post         := 2048.0 ;
   X_Type       := 0      ;
   Rate         := 21     ;   { Set Sample Rate to 10 MHz  }
   Screen       := 21     ;   { Set Display Rate to 10 MHz }
   errcode      := 0      ;
   Start        := 0      ;
   Grid         := 0      ;

Offset_Calc;
   Setup_20M(Status, Gain, 0,0,0,0,0,0,0, 824, 1 );
   Get_Config(ConNum);

IF (ConNum<>20) AND (ConNum<>21)
      THEN

BEGIN
            ClrScr;
            WriteLn('POWER TO SCOPE MAY BE OFF, PLEASE CHECK');
            WriteLn('PRESS ANY KEY TO CONTINUE');
            REPEAT UNTIL keypressed;
            read(KBD, mkey);
         END;

Get_Config(ConNum);
   IF (ConNum = 21)
      THEN
         maxbuffersize := 129535.0;

{ On Initial Start, Go Directly Into Option # 3,      }
   { Monitor and Sample Voltage and Current Waveforms    }
   {           Version 2.1 Modification                  }

Timegraph ( Offset, Status, Compress, Start, Count,
               Gain, Pre, Post, Position, Base, Level, Rate,
               T_Type, Screen, Mask, Scale, X_Type, Grid   );

{ Start of Main Program Loop   }
```

```
REPEAT
  CLRSCR  ;
  WRITELN                                                            ;
  TextBackground(1);
  TextColor(15);
  WRITELN ( '   Antenna Monitor Main Menu Options   ' ) ;
  TextColor(15);
  TextBackground(0);
  WRITELN  ;
  WRITELN ( '1) Set Monitor Parameters'                           ) ;
  WRITELN ( '2) Calibrate Channels -- A..Zero=',Zero[0]:8:3,
        ', B..Zero=',Zero[1]:8:3);
  WRITELN ( '3) View or Sample Voltage and Current Waveforms'  ) ;
  WRITELN ( '4) Stop the Program'                                ) ;
  GoToXY(30,16);
  TextBackground(1);
  TextColor(31);
  WriteLn('   SELECT OPTION   1..4   ');
  TextBackground(0);
  TextColor(14);
  NOSCINFO ;

{ Main Menu Option Display Screen }

READ ( KBD, selection ) ;
  CASE selection OF

{ Set Time Parameters }

'1' : Time_Setup ( Gain,Rate,Screen,T_Type,
                IO_Type,Mask,Pre,Post,Base   );

{ Calibrate Channels }

'2' : BEGIN
          Port[stdnld] := 0;
          ClrScr;
          GoToXY(10,11);
        Write('Select Calibration Type (0=Internal,1=External): ');
          t := Cal_Type;
          {$I-}
          Buflen := 1;
          Readln(Cal_Type);
          {$I+}
          IF (IOresult<>0) OR (Cal_Type>1) THEN Cal_Type := t;
          Setup_20M(Status, Gain, 0,0,0,0,0,0,0, 824, 1 );
          AutoCal( Cal_Type, Cal_Array, Cal_Status);

FOR I:= 0 TO 1 DO

BEGIN
             Zero[I]:=Hi(Cal_Array[I]) + Lo(Cal_Array[I])/256.0;
             Calibration[I] := Trunc(Zero[I]);
           END;

IF Cal_Status<>0 THEN

BEGIN
             ClrScr;

FOR I := 0 TO 1 DO
               Zero[I] := 128.000;
```

```
                WHILE NOT (KeyPressed) DO
                BEGIN
                  GoToXY(10,11);
                  Writeln('Error in Calibration.');
                  GoToXY(10,14);
                  Writeln('Hit any key to resume.');
                END;

Read(Kbd,Ch);
            END;
        END;

{ Monitor and Sample Voltage and Current Waveforms }

'3' : Timegraph ( Offset, Status, Compress, Start, Count,
                     Gain, Pre, Post, Position, Base, Level, Rate,
                     T_Type, Screen, Mask, Scale, X_Type, Grid     );

{ Quit the Program }

'4' : BEGIN
            ClrScr;
            Exit
            End
         END ;

UNTIL forever ;
END.

{     End of Program Grossr.Pas    }
```

```
{++++++++++++++++++++++++++++++++++++++++++++++++++++++++++++++++++++++}
{                                                                      }
{                       FILE GROSSR2.PAS                               }
{                                                                      }
{   This File Contains A Set of Procedures That Are Used By            }
{   The NOSC Antenna Monitor System Program GROSSR.PAS.  The           }
{   Procedures Are Linked to GROSSR.PAS and This File Needs            }
{   To Be Present in The Same Directory Whenever GROSSR.PAS            }
{   Is Compiled to a .COM File or Run In the Turbo Editor.             }
{        Some of The Procedures Contained in This File Were            }
{   Supplied by Rapid Systems Inc. Along With The R370                 }
{   System.  These Procedures Are Marked As Such With R.S.             }
{   In The Editing History at The Beginning of Each Procedure.         }
{   The Remainder of Procedures Have Been Developed By NOSC            }
{   Systems Development Branch, Code 832.                              }
{                                                                      }
{             Version 1.0    9/1/89    by S.C.T.                       }
{                                                                      }
{++++++++++++++++++++++++++++++++++++++++++++++++++++++++++++++++++++++}
```

```
{-----------------------------------------------------------------------}

{                       SETUP_20M PROCEDURE                             }
{    This procedure must be called to set up an acquisition             }
{    cycle.  Once called, so long as no sampling requirements           }
{    change, data may be acquired by using the GO procedure.            }
{                                                                       }
{             Version 1.0    by R.S.                                    }

PROCEDURE Setup_20M ( VAR Status  : Integer ;
                             VAR Gain    : Dat2    ;
                                 Rate    : Byte    ;
                                 T_Type  : Byte    ;
                                 Level   : Byte    ;
                                 Pre_B   : Integer ;
                                 Pre_O   : Integer ;
                                 Post_B  : Integer ;
                                 Post_O  : Integer ;
                                 Base    : Integer ;
                                 IO_Type : Byte         );
       External 'T2060';

{-----------------------------------------------------------------------}

{                          GO PROCEDURE                                 }
{    This procedure is called to initiate an acquisition cycle          }
{    by bypassing the DSP board; No parameters are passed.              }
{                                                                       }
{             Version 1.0    by R.S.                                    }

PROCEDURE Go ;
         External Setup_20M[3];

{-----------------------------------------------------------------------}

{                       GET_STATUS PROCEDURE                            }
{    This procedure is called to retrieve the acquisition               }
{    status.  The status parameter is passed to the address             }
{    defined in the setup command as defined under the SETUP            }
{    procedure.                                                         }
{                                                                       }
{             Version 1.0    by R.S.                                    }

PROCEDURE Get_Status ;
         External Setup_20M[6];

{-----------------------------------------------------------------------}
```

```
{--------------------------------------------------------------------------}

{               XFER_20M_DATA PROCEDURE                         }
    { This procedure is called to pass the raw data to the Turbo    }
    { data buffer "DISPLAY".                                        }
    {                                                               }
    {           Version 1.0    by R.S.                              }

PROCEDURE Xfer_20M_Data ( VAR Display   : Dat1024 ;
                              VAR Compress  : Integer ;
                              VAR Start     : Integer ;
                              VAR Count     : Integer ;
                                  Pos_B     : Integer ;
                                  Pos_O     : Integer ;
                                  Screen    : Byte    ;
                                  Mask      : Byte    ;
                                  X_Type    : Byte          );
       External Setup_20M[9];

{--------------------------------------------------------------------------}

{               AUTOCAL PROCEDURE                               }
    { This Procedure Calibrates the 2 Input Channels.               }
    {                                                               }
    {           Version 1.0    by R.S.                              }

PROCEDURE AutoCal (     Cal_Type     : BYTE ;
                        VAR Cal_Array    : Cal_Array_Type ;
                        VAR Cal_Status   : BYTE                );
       EXTERNAL Setup_20M[15];

{--------------------------------------------------------------------------}

{               CLEAR PROCEDURE                                 }
    { This procedure is called to clear the time series display.    }
    {                                                               }
    {           Version 1.0    by R.S.                              }

PROCEDURE Clear( Var Display : Dat1024) ;
      BEGIN

Plot_Time ( Display,Offset,Calibration,0,0,Scale,0,0,0,0,0,1 );

END;    { Procedure Clear }

{--------------------------------------------------------------------------}
```

```
{                          REDRAW PROCEDURE                              }
{   This procedure is used to redraw the time series waveform            }
{   after a triggering event or option selection.                        }
{                                                                        }
{                  Version 1.0   by R.S.                                 }

PROCEDURE ReDraw( VAR Display        : Dat1024 ;
                          VAR Compress, Start : Integer ;
                              Count           : Integer ;
                          VAR Pos_B, Pos_O    : Integer ;
                              Position        : Real      );

BEGIN
            GoToXY(1,20);
            IF Position > 0.0 THEN

BEGIN
                 Pos_B := 1;
                 Pos_O := Trunc(Position-32768.0);
               END

ELSE

IF Position < 0.0 THEN
               BEGIN
                 Pos_B := -1;
                 Pos_O := Trunc(Position+32768.0);
               END ELSE    { If Position = 0 }

BEGIN
                 Pos_B := 0;
                 Pos_O := 0;
               END;

Xfer_20M_Data( Display,Compress,Start,Count,Pos_B,Pos_O,Screen,Mask,X_Type );
Plot_Time ( Display,Offset,Calibration,0,Grid,Scale,Mask,0,0,Count,0,1 );

END;   { Procedure Redraw }
```

```
{                       TIMELABEL PROCEDURE                              }
{   Procedure TimeLabel annotates the display.                           }
{                                                                        }
{                                                                        }
{                    .  EDITING HISTORY                                  }
{             ----------------------------------------                   }
{                Version 1.0   by R.S.                                   }
{                Version 1.1   by S.C.T.   5/23/89                       }
{                  Modified Display to say "VOLTAGE and CURRENT          }
{                  Time Waveforms", showed channel Full Scale            }
{                  (F.S.) Levels, Removed Unused OScope Displays.        }
{                Version 1.2   by S.C.T.  10/17/89                       }
{                  Removed Channel On/Off Status Display.                }
```

```
PROCEDURE TimeLabel( VAR Display : Dat1024;
                         Scale   : BYTE     ;
                         Gain    : Dat2     ;
                         T_Type,
                         Screen,
                         Rate,
                         Si,
                         Level   : BYTE         );

VAR
        I,K,Pre_B,Pre_O,Post_B,Post_O : INTEGER ;

BEGIN
       Clear ( Display ) ;
       GoToXY (29,1) ;
         Writeln( 'VOLTAGE and CURRENT Time Waveforms' ) ;
       GoToXY(1,3) ;
         FOR I := 0 to 1 DO BEGIN
              K := ( Mask AND (1 shl I) ) shr I ;
              Writeln( 'Channel ' , chanstr[I] );
              Writeln( ' at ' , gainstr[ Gain[I] ],'F.S.' );
              Writeln ;
            END;

GoToXY(1,11) ;
         Writeln( 'Sampled at ' );
         Writeln( timestr[Rate] );
         IF Pre < 0.0 THEN BEGIN
              Pre_B := -1;
              Pre_O := Trunc(Pre+32768.0);
            END

ELSE

BEGIN
              Pre_B := 0;
              Pre_O := 0;
            END;

IF Post > 0.0 THEN

BEGIN
              Post_B := 1;
              Post_O := Trunc(Post-32768.0);
            END

ELSE

BEGIN
              Post_B := 0;
              Post_O := 0;
            END;

SETUP_20M ( Status, Gain,Rate, T_Type, Level, Pre_B,
               Pre_O, Post_B, Post_O, Base, IO_Type     );

IF Status < 0 THEN

BEGIN
              TextMode;
              EXIT;
            END;

GO;

END;   { Procedure TimeLabel }
```

```
{                                                                           }
         {               GETSCALE PROCEDURE                       }
         { This procedure is used to get the voltage and current scale }
         { factors and store them in the variables defined in the  }
         { procedure.                                              }
         {                                                         }
         {         Version 1.0   by S.C.T.   5/12/1989             }

PROCEDURE GetScale( VAR Gain                  : Dat2;
                             VAR VScFactor, IScFactor : Real  );

VAR
               VGainValue,IGainValue : Integer;

BEGIN
               VGainValue := lo(Gain[0]);
               IGainValue := lo(Gain[1]);

CASE VGainValue OF  { Assign Array Value to VScFactor Variable }

0  : VScFactor := 0.001;
                     1  : VScFactor := 0.002;
                     2  : VScFactor := 0.005;
                     3  : VScFactor := 0.010;
                     4  : VScFactor := 0.020;
                     5  : VScFactor := 0.050;
                     6  : VScFactor := 0.100;
                     7  : VScFactor := 0.200;
                     8  : VScFactor := 0.500;
                     9  : VScFactor := 1.000;
                    10  : VScFactor := 2.000;
                    11  : VScFactor := 5.000;

END;

CASE IGainValue OF  { Assign Array Value to IScFactor Variable }

0  : IScFactor := 0.001;
                     1  : IScFactor := 0.002;
                     2  : IScFactor := 0.005;
                     3  : IScFactor := 0.010;
                     4  : IScFactor := 0.020;
                     5  : IScFactor := 0.050;
                     6  : IScFactor := 0.100;
                     7  : IScFactor := 0.200;
                     8  : IScFactor := 0.500;
                     9  : IScFactor := 1.000;
                    10  : IScFactor := 2.000;
                    11  : IScFactor := 5.000;

END;

END;  {  Procedure GetScale  }
```

```
{--------------------------------------------------------------------}

{              GETTIME PROCEDURE                               }
      { This procedure is used to acquire the current time and date  }
      { from DOS. The procedure stores this information in a set of  }
      { variables defined below.                                     }
      {                                                              }
      {          Version 1.0   by S.C.T.   5/12/89                   }
      {          Version 1.1   by S.C.T.   10/17/89                  }
      {             Modified program to get only the last 2          }
      {             digits of the year.                              }
      {                                                              }

PROCEDURE GetTime( VAR Hour,Min,Sec,Frac,Day,Month,
                             Year,DayOfWeek : Integer );

TYPE
          RegPack = record
                      AX,BX,CX,DX,BP,SI,DI,DS,ES,Flags: Integer;

end;

VAR
          Regs: RegPack;

BEGIN
          With Regs DO

BEGIN

{ Get Time Values From DOS }

AX   := $2C00;
              MsDos(Regs);
              Hour := hi(CX);
              Min  := lo(CX);
              Sec  := hi(DX);
              Frac := lo(DX);

{ Get Date and Day of The Week Values From DOS }

AX   := $2A00;
              MsDos(Regs);
              Day        := lo(DX);
              Month      := hi(DX);
              Year       := (CX-1900);
              DayOfWeek  := lo(AX);

END;

END;              { Procedure GetTime }

{--------------------------------------------------------------------}
```

```
{                             Timegraph PROCEDURE                              }
{  This procedure is the main program loop.  After selecting                   }
{  option 3 from the main menu in the program grossr this                      }
{  procedure is used to sample, display, calculate and store                   }
{  the antenna system parameters.                                              }
{                                                                              }
{                                                                              }
{                         EDITING HISTORY                                      }
{                  ----------------------------------------                    }
{                  Version 1.0    by   R.S.                                    }
{                  Version 2.0    by   S.C.T.   9/14/89                        }
{                    Modified to Collect Data, Calculate Gross R               }
{                    and Store Data Calculated.                                }
{                  Version 2.1    by   S.C.T.   10/2/1989                      }
{                    Added feature to store data in time indexed               }
{                    file and added correction for phase shift in              }
{                    voltage pickup.                                           }
{                  Version 2.2    by S.C.T.    10/17/1989                      }
{                    Modified phase correction and file                        }
{                    date algorithm.                                           }
{                  Version 2.3 by S.C.T.       12/13/1989                      }
{                    Added Calibration Data Header to the                      }
{                    Beginning of the Data Storage File.                       }
{                                                                              }

PROCEDURE Timegraph ( VAR Offset        : Dat_2      ;
                              VAR Status        ,
                                  Compress      ,
                                  Start         ,
                                  Count         : INTEGER    ;
                              VAR Gain          : Dat2       ;
                              VAR Pre           ,
                                  Post          ,
                                  Position      : REAL       ;
                              VAR Base          : INTEGER    ;
                              VAR Level         ,
                                  Rate          ,
                                  T_Type        ,
                                  Screen        ,
                                  Mask          ,
                                  Scale         ,
                                  X_Type        ,
                                  Grid          : BYTE            ) ;

LABEL   Continue, CleanUp ;

VAR
          Hour, Minute, Sec, Frac                 : INTEGER    ;
          Day, Month, Year, DayOfWeek             : INTEGER    ;
          NumSamples                              : INTEGER    ;
          I,D,N, Max, Min, MaxIndex               : INTEGER    ;
          Tempcnt                                 : INTEGER    ;
          ErrorFlag                               : INTEGER    ;
          Delaylength                             : INTEGER    ;
          DataStoreFileCount                      : INTEGER    ;
          DSFNumber                               : INTEGER    ;
          Vsum, Isum, VIsum, GrossR               : REAL       ;
          Vrms, Irms, CosPhi, SinPhi, Phi         : REAL       ;
          DerivConst, VScFactor, IScFactor        : REAL       ;
          VIDerSum, Reactance                     : REAL       ;
          t, t1                                   : REAL       ;
          VCalFactor , ICalFactor                 : REAL       ;
          SinPhiCal , CosPhiCal                   : REAL       ;
          CorrSinPhi , CorrCosPhi                 : REAL       ;
          Dummy                                   : REAL       ;
          Dat, Test                               : CHAR       ;
          X                                       : CHAR       ;
          Mo, Da, Yr, Hr, Sc                      : String[2]  ;
          StoreFileName                           : String[14];
```

```
CalFileName                              : String[14];
InString                                 : String[7] ;
StoreFileVar                             : TEXT      ;
CalFileVar                               : TEXT      ;
Display                                  : Dat1024   ;
temp,k,Si,templev                        : BYTE      ;
key, DONE                                : BOOLEAN   ;

BEGIN    { Start the Data Collection }

{ Read the External File Parameters Into the Program }
   { And Assign Them to the Corresponding Variables     }

CalFileName := ('Data.set');
  Assign ( CalFileVar , CalFileName );
  Reset  ( CalFileVar );
  Readln ( CalFileVar , NumSamples    );
  Readln ( CalFileVar , DSFNumber     );
  Readln ( CalFileVar , Delaylength   );
  Readln ( CalFileVar , SinPhiCal     );
  Readln ( CalFileVar , CosPhiCal     );
  Readln ( CalFileVar , VCalFactor    );
  Readln ( CalFileVar , ICalFactor    );
  Close  ( CalFileVar );

{ Initialize Display Variables } key := FALSE ;
  Si  := 0;
  HIRES ;
  IF HardwarePresent THEN
  IF DisplayType = IBMEGA THEN HIRESCOLOR(0)
    ELSE HIRESCOLOR(0);

{ Draw the Signal Display Box }

DRAW(127,   9, 639,   9, 1 ) ;
  DRAW(639, 138, 128, 138, 1 ) ;
  DRAW(127, 137, 127,  10, 1 ) ;
  TimeLabel( Display,Scale,Gain,T_Type,Screen,Rate,Si,Level );

{ Initialize the Data Storage File Name and Reset the }
   { Data Storage Element Number Counter                 }

GetTime( Hour,Minute,Sec,Frac,Day,Month,Year,DayOfWeek );
  DataStoreFileCount := 0;
  Str ( Month , Mo );
  Str ( Day   , Da );
  Str ( Year  , Yr );
  Str ( Hour  , Hr );
  Str ( Sec   , Sc );
  StoreFileName := Concat ('A:',Mo,Yr,Da,Hr,'.DAT' );
  Assign ( StoreFileVar , StoreFileName );
  Rewrite ( StoreFileVar );
  Writeln ( StoreFileVar , VCalFactor,' ',ICalFactor,' ',
            SinPhiCal,' ',CosPhiCal );
```

```
{  Set Up Gross R Data Display Text }
GOTOXY(28,19);
Writeln ('                                                         ');
GOTOXY(28,19);
Writeln ('Data Being Written to File ',StoreFileName );
GOTOXY(15,20);
Writeln ('                                                         ');
GoToXY(20,21);
Write ('Current Time Is    ');
GoToXY(10,22);
Write ('Antenna Parameters Are:   V-RMS  = ');
GoToXY(60,22);
Write ('I-RMS  = ');
GoToXY(15,23);
Write ('Phase Angle = ');
GoToXY(48,23);
Write ('Gross Resistance = ');
NOSCINFO ;

{ Start the Main Data Collection Loop }

Continue:

IF KeyPressed THEN

BEGIN
        Key:=TRUE;
        Read(kbd,x);
        x := UpCase(x);
        If x<>#13 then GoTo CleanUp;
      END;

Get_Status ;

IF ( Status AND 6 ) <> 6 THEN GoTo Continue; { Not Triggered Yet }

{ DSP Board is now triggered and data acquisition complete }

GetTime( Hour,Minute,Sec,Frac,Day,Month,Year,DayOfWeek );
   IF Position > 0.0 THEN BEGIN
        Pos_B:=1;
        Pos_O:=Trunc(Position-32768.0);
      END
   ELSE IF Position < 0.0 THEN BEGIN
        Pos_B:=-1;
        Pos_O:=Trunc(Position+32768.0);
      END

ELSE

BEGIN
        Pos_B:=0;
        Pos_O:=0;
      END;

Count:=512;
   Xfer_20M_Data( Display,Compress,Start,Count,
              Pos_B,Pos_O,Screen,Mask,X_Type );
```

```
Plot_Time ( Display,Offset,Calibration,0,
            Grid,Scale,Mask,0,0,Count,0,1 );

IF Key AND (x=#13) THEN GoTo CleanUp;

{       Calculate the Antenna Parameters        }

DerivConst := 29.75419;
Vsum := 0;
Isum := 0;
VIsum := 0;
VIDerSum := 0;
DataStoreFileCount := ( DataStoreFileCount + 1 );
FOR N :=   1 TO (NumSamples) DO BEGIN
    Vsum := Vsum + (Display[N]-128.0)*(Display[N]-128.0);
    Isum := Isum + (Display[N+512]-128.0)*(Display[N+512]-128.0);
    VIsum := VIsum + (Display[N]-128.0)*(Display[N+512]-128.0);
    VIDerSum := VIDerSum + (Display[N]-128.0)*DerivConst*
                (Display[(512+N)-1]-Display[(512+N)+1]);
  END;

GetScale(Gain,VScFactor,IScFactor);

{   Calculate RMS Voltage and Current  }

Vrms := Sqrt(Vsum/NumSamples)*VScFactor*VCalFactor;
IF Vrms <= 1E-12 THEN Vrms := 1E-12;
Irms := Sqrt(Isum/NumSamples)*IScFactor*ICalFactor;
IF Irms <= 1E-10 THEN Irms := 1E-10;

{   Calculate Sine and Cosine of Phase Angle Phi  }

CosPhi := ((1/(Vrms*Irms)))*
((VIsum*VScFactor*VCalFactor*IScFactor*ICalFactor)/NumSamples);
SinPhi := ((1/(2*Vrms*Irms)))*
((VIDerSum*VScFactor*VCalFactor*IScFactor*ICalFactor)/NumSamples);
IF ABS(SinPhi) <= 1E-10 THEN SinPhi := 1E-10;

{ Correct Sine and Cosine Using External Cal Factors }

CorrSinPhi := ( SinPhi*CosPhiCal + CosPhi*SinPhiCal );
CorrCosPhi := ( CosPhi*CosPhiCal - SinPhi*SinPhiCal );
IF ABS(CorrCosPhi) <= 1E-10 THEN CorrCosPhi := 1E-10;
IF ABS(CorrSinPhi) <= 1E-10 THEN CorrSinPhi := 1E-10;
IF (Irms <= 1E-6) OR (Vrms<=1E-6) THEN Phi := 0
   ELSE
Phi := ((ARCTAN (SQRT(1/(CorrCosPhi*CorrCosPhi)-1)))*57.296);

{ Calculate Gross Resistance }

GrossR := ((Vrms/Irms)*CorrCosPhi);

{ Calculate Reactance      }

Reactance := ((Vrms/Irms)*CorrSinPhi);

{ Write Date, VRMS, IRMS, Phase Info, and GrossR to the Screen }
GOTOXY(38,21);
Writeln ( Hour, ':', Minute, ':', Sec, ' On ',
          Month, '-', Day, '-', Year, ' '         );
GoToXY(44,22);
Write ((Vrms):0:3,' Volts    ');
GoToXY(69,22);
```

```
Write ((Irms):0:3,' Amps      ');
GoToXY(29,23);
Write ((CorrSinPhi/ABS(CorrSinPhi))*Phi:0:2,' Degrees    ');
GoToXY(67,23);
Write (GrossR:0:4,' Ohms      ');
GoToXY (15,24);
Write ('CosPhi = ',CorrCosPhi:0:3,'   ');
GoToXY (48,24);
Writeln ('SinPhi = ',CorrSinPhi:0:3,'   ');
```

I claim:

1. A method to determine and indicate in near real time antenna electrical circuit parameters, for VLF and LF transmitting antennas transmitting frequency shift keyed modulation comprising:

feeding at least one block of antenna frequency shift keyed modulation sample signals from an antenna sensing section to an analog-to-digital converter and to a trigger circuit;

monitoring said block of antenna frequency shift keyed modulation sample signals by said trigger circuit;

providing an output trigger signal by said trigger circuit when said trigger circuit indicates that a steady state condition of said block of frequency shift keyed modulation sample signals has been reached;

enabling said analog-to-digital converter by said trigger circuit output trigger signal to receive said block of sample signals when, firstly, an interconnected computer indicates to said analog-to-digital converter that said computer is ready to download samples thereto, and secondly, when said trigger circuit provides said output trigger signal which indicates that said steady state condition has been reached;

transmitting said block of sample signals by said analog-to-digital converter to said computer upon the receipt of said output trigger signal;

monitoring by said computer the state of said analog-to-digital converter to determine that said block of sample signals has been transmitted to said computer by said analog-to-digital converter;

transforming said block of sample signals in said computer to determine and provide indications in near real time of antenna electrical circuit parameters of antenna feed-point voltage, antenna current, gross resistance, gross reactance, and steady-state phase angle between the voltage and current; and idling said analog-to-digital converter by said computer until said computer is finished with said transforming.

2. A method according to claim 1 in which said transforming provides said antenna electrical circuit parameters of said antenna feed-point voltage, in accordance with the relationship $$\hat{V}_{rms} = \left( \frac{1}{j} \cdot \sum_{i=1}^{j} V_s^2[iT_s] \right)^{\frac{1}{2}} \quad (10)$$

antenna current, in accordance with the relationship $$\hat{I}_{rms} = \left( \frac{1}{j} \cdot \sum_{i=1}^{j} I_s^2[iT_s] \right)^{\frac{1}{2}} \quad (11)$$

gross resistance, in accordance with the relationship $$\hat{R}_g = \frac{\hat{V}_{rms}}{\hat{I}_{rms}} \cdot \hat{\cos}(\phi) \quad (13)$$

gross reactance, in accordance with the relationship $$X(\omega) = \frac{\hat{V}_{rms}}{\hat{I}_{rms}} \cdot \hat{\sin}(\phi) \quad (17)$$

and steady-state phase angle between the voltage and current in accordance with the relationship $$\hat{\sin}(\phi) = \frac{-1}{j} \cdot \left[ \sum_{i=1}^{j} \frac{V_s(iT_s) \cdot \frac{d\hat{I}(iT_s)}{dt}}{\hat{V}_{rms} \cdot \hat{I}_{rms}} \right] \quad (15)$$

3. An apparatus to determine and indicate in near real time antenna electrical circuit parameters, for VLF and LF transmitting antennas transmitting frequency shift keyed modulation comprising:

means for feeding repetitive blocks of antenna frequency shift keyed modulation sample signals received from an antenna sensing section operably disposed with respect to said transmitting antenna;

means coupled to the feeding means to receive at least one block of frequency shift keyed modulation sample signals for monitoring said block of antenna frequency shift keyed modulation sample signals including a trigger circuit that provides an output trigger signal when said trigger circuit indicates that a steady state condition of said block of frequency shift keyed modulation sample signals has been reached;

an analog-to-digital converter coupled to the feeding means to receive said blocks of antenna frequency shift keyed modulation sample signals;

means for computing including a computer operated on by an appropriate computer program;

means coupled to the monitoring means to receive said output trigger signal for enabling said analog-to-digital converter by said output trigger signal to receive said block of sample signals when, firstly, said computer indicates to said analog-to-digital converter that said computer is ready to download said block of sample signals thereto, and secondly, when said trigger circuit provides said output trigger signal which indicates that said steady state condition has been reached; and means coupled to said analog-to-digital converter and said computer for transmitting said block of sample signals by said analog-to-digital converter to said computer upon the receipt of said output trigger signal, said computer monitors the state of said analog-to-digital converter to determine that said block of sample signals has been transmitted to said computer by said analog-to-digital converter, said computer processes said block of sample signals in accordance with a computer program to determine and provide indications in near real time in near real time antenna electrical circuit parameters of antenna feed- point voltage, antenna current, gross resistance, gross reactance, and steady-state phase angle between the voltage and current, and said computer idles said analog-to-digital converter from transmitting a subsequent block of sample signals until said computer is finished with the processing.

4. An apparatus according to claim 3 in which said transforming provides said antenna electrical circuit parameters of said antenna feed-point voltage, in accordance with the relationship $$\hat{V}rms = \left( \frac{1}{j} \cdot \sum_{i=1}^{j} Vs^2[iTs] \right)^{\frac{1}{2}} \quad (10)$$

antenna current, in accordance with the relationship $$\hat{I}rms = \left( \frac{1}{j} \cdot \sum_{i=1}^{j} Is^2[iTs] \right)^{\frac{1}{2}} \quad (11)$$

gross resistance, in accordance with the relationship $$\hat{R}g = \frac{\hat{V}rms}{\hat{I}rms} \cdot \cos(\hat{\phi}) \quad (13)$$

gross reactance, in accordance with the relationship $$X(\omega) = \frac{\hat{V}rms}{\hat{I}rms} \cdot \sin(\hat{\phi}) \quad (17)$$

and steady-state phase angle between the voltage and current in accordance with the relationship $$\sin(\hat{\phi}) = \frac{-1}{j} \cdot \left[ \sum_{i=1}^{j} \frac{Vs(iTs) \cdot \frac{d\hat{I}(iTs)}{dt}}{\hat{V}rms \cdot \hat{I}rms} \right] \quad (15)$$

5. A method to determine and indicate in near real time antenna electrical circuit parameters, for VLF and LF transmitting antennas transmitting frequency shift keyed modulation comprising:
feeding at least one block of antenna frequency shift keyed modulation sample signals from an antenna sensing section to an analog-to-digital converter and to a trigger circuit;
monitoring said block of antenna frequency shift keyed modulation sample signals by said trigger circuit;
providing an output trigger signal by said trigger circuit when said trigger circuit indicates that a steady state condition of said block of frequency shift keyed modulation sample signals has been reached;
enabling said analog-to-digital converter by said trigger circuit output trigger signal to receive and digitize said block of frequency shift keyed modulation sample signals when, firstly, an interconnected computer indicates to said analog-to-digital converter that said computer is ready to download a block of digitized sample signals representative of said block of antenna frequency shift keyed modulation sample signals thereto, and secondly, when said trigger circuit provides said output trigger signal which indicates that said steady state conditions has been reached;
transmitting said block of digitized sample signals by said analog-to-digital converter to said computer upon the receipt of said output trigger signal;
monitoring by said computer the state of said analog-to-digital converter to determine that said block of digitized sample signals has been transmitted to said computer by said analog-to-digital converter;
transforming said block of digitized sample signals in said computer to determine and provide indications in near real time of antenna electrical circuit parameters of antenna feed- point voltage, antenna current, gross resistance, gross reactance, and steady-state phase angle between the voltage and current; and
idling said analog-to-digital converter by said computer until said computer is finished with said transforming.

6. A method according to claim 5 in which said transforming provides said antenna electrical circuit parameters of said antenna feed-point voltage, in accordance with the relationship $$\hat{V}rms = \left( \frac{1}{j} \cdot \sum_{i=1}^{j} Vs^2[iTs] \right)^{\frac{1}{2}} \quad (10)$$

antenna current, in accordance with the relationship $$\hat{I}rms = \left( \frac{1}{j} \cdot \sum_{i=1}^{j} Is^2[iTs] \right)^{\frac{1}{2}} \quad (11)$$

gross resistance, in accordance with the relationship $$\hat{R}g = \frac{\hat{V}rms}{\hat{I}rms} \cdot \cos(\hat{\phi}) \quad (13)$$

gross reactance, in accordance with the relationship $$X(\omega) = \frac{\hat{V}rms}{\hat{I}rms} \cdot \sin(\hat{\phi}) \quad (17)$$

and steady-state phase angle between the voltage and current in accordance with the relationship $$\sin(\hat{\phi}) = \frac{-1}{j} \cdot \left[ \sum_{i=1}^{j} \frac{Vs(iTs) \cdot \frac{d\hat{I}(iTs)}{dt}}{\hat{V}rms \cdot \hat{I}rms} \right] \quad (15)$$

7. An apparatus to determine and indicate in near real time antenna electrical circuit parameters, for VLF and LF transmitting antennas transmitting frequency shift keyed modulation comprising:
means for feeding repetitive blocks of antenna frequency shift keyed modulation sample signals received from an antenna sensing section operably disposed with respect to said transmitting antenna;
an analog-to-digital converted coupled to the feeding means to receive said blocks of antenna frequency shift keyed modulation sample signals;

means coupled to said feeding means to received at least one block of frequency shift keyed modulation sample signals for monitoring said block of antenna frequency shift keyed modulation sample signals and including a trigger circuit that provides an output trigger signal when said trigger circuit indicates that a steady state condition of said block of antenna frequency shift keyed modulation sample signals has been reached;

means for computing including a computer operated on by an appropriate computer program;

means coupled to the monitoring means to receive said output trigger signal for enabling said analog-to-digital converter by said output trigger signal to receive and digitize said block of antenna frequency shift keyed modulation sample signals when, firstly, said computer indicates to said analog-to-digital converter that said computer is ready to download a block of digitized sample signals representative of said blocks of antenna frequency shift keyed modulation sample signals thereto, and secondly, when said trigger circuit provides said output trigger signal which indicates that said steady state condition has been reached; and means coupled to said analog-to-digital converter and said computer for transmitting said block of digitized sample signals by said analog-to-digital converter to said computer upon the receipt of said output trigger signal, said computer monitors the state of said analog-to-digital converter to determine that said block of digitized sample signals has been transmitted to said computer by said analog-to-digital converter, said computer processes said block of digitized sample signals in accordance with a computer program to determine and provide indications in near real time of antenna electrical circuit parameters of antenna feed-point voltage, antenna current, gross resistance, gross reactance, and steady-state phase angle between the voltage and current, and said computer idles said analog-to-digital converter from transmitting a subsequent block of sample signals until said computer is finished with the processing.

8. An apparatus according to claim 7 in which said transforming provides said antenna electrical circuit parameters of said antenna feed-point voltage, in accordance with the relationship $$\hat{V}_{rms} = \left( \frac{1}{j} \cdot \sum_{i=1}^{j} V_s^2[iT_s] \right)^{\frac{1}{2}} \quad (10)$$

antenna current, in accordance with the relationship $$\hat{I}_{rms} = \left( \frac{1}{j} \cdot \sum_{i=1}^{j} I_s^2[iT_s] \right)^{\frac{1}{2}} \quad (11)$$

gross resistance, in accordance with the relationship $$\hat{R}_g = \frac{\hat{V}_{rms}}{\hat{I}_{rms}} \cdot \hat{\cos}(\phi) \quad (13)$$

gross reactance, in accordance with the relationship $$X(\omega) = \frac{\hat{V}_{rms}}{\hat{I}_{rms}} \cdot \hat{\sin}(\phi) \quad (17)$$

and steady-state phase angle between the voltage and current in accordance with the relationship $$\hat{\sin}(\phi) = \frac{-1}{j} \cdot \left[ \sum_{i=1}^{j} \frac{V_s(iT_s) \cdot \frac{dI(iT_s)}{dt}}{\hat{V}_{rms} \cdot \hat{I}_{rms}} \right] \quad (15)$$

* * * * *